United States Patent
Hashizume

(10) Patent No.: US 11,868,034 B2
(45) Date of Patent: Jan. 9, 2024

(54) PHOSPHOR PARTICLE, WAVELENGTH CONVERSION ELEMENT, LIGHT SOURCE DEVICE, METHOD OF MANUFACTURING PHOSPHOR PARTICLE, METHOD OF MANUFACTURING WAVELENGTH CONVERSION ELEMENT, AND PROJECTOR

(71) Applicant: SEIKO EPSON CORPORATION, Tokyo (JP)

(72) Inventor: Toshiaki Hashizume, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 314 days.

(21) Appl. No.: 17/446,103

(22) Filed: Aug. 26, 2021

(65) Prior Publication Data

US 2022/0066303 A1     Mar. 3, 2022

(30) Foreign Application Priority Data

Aug. 27, 2020    (JP) ................................ 2020-143932

(51) Int. Cl.
    *G03B 21/20*      (2006.01)
    *H01L 33/50*      (2010.01)
    *H01L 33/00*      (2010.01)

(52) U.S. Cl.
    CPC .......... *G03B 21/204* (2013.01); *H01L 33/005* (2013.01); *H01L 33/502* (2013.01); *H01L 2933/0041* (2013.01)

(58) Field of Classification Search
CPC ... G03B 21/204; H01L 33/005; H01L 33/502; H01L 2933/0041; H05B 33/14; C09K 11/7774
See application file for complete search history.

(56) References Cited

U.S. PATENT DOCUMENTS

| | | | |
|---|---|---|---|
| 11,172,176 B2 * | 11/2021 | Hashizume | .......... H04N 9/3158 |
| 11,572,502 B2 * | 2/2023 | Hashizume | ........ C09K 11/0838 |
| 2003/0102797 A1 | 6/2003 | Kajiwara | |
| 2018/0216800 A1 * | 8/2018 | Yamanaka | ................ F21V 9/38 |
| 2019/0062627 A1 | 2/2019 | Takasone et al. | |
| 2020/0304764 A1 | 9/2020 | Hashizume | |
| 2022/0136679 A1 * | 5/2022 | Kanno | .................. F21S 41/176 362/516 |

FOREIGN PATENT DOCUMENTS

| | | |
|---|---|---|
| EP | 3 412 752 A1 | 12/2018 |
| JP | 2004-307869 A | 11/2004 |
| JP | 2017-137394 A | 8/2017 |
| JP | 2019-045844 A | 3/2019 |
| JP | 2020-154032 A | 9/2020 |

* cited by examiner

*Primary Examiner* — Tracie Y Green
(74) *Attorney, Agent, or Firm* — Oliff PLC

(57) ABSTRACT

A phosphor particle is configured to emit fluorescence longer in wavelength than excitation light entering the phosphor particle. The phosphor includes a concave portion which is no smaller than 0.1 times as large as the wavelength of the fluorescence and no larger than 10 times as large as the wavelength of the fluorescence. The concave portion is disposed on a surface of the phosphor particle.

13 Claims, 15 Drawing Sheets

PHOSPHOR PARTICLE, WAVELENGTH CONVERSION ELEMENT, LIGHT SOURCE DEVICE, METHOD OF MANUFACTURING PHOSPHOR PARTICLE, METHOD OF MANUFACTURING WAVELENGTH CONVERSION ELEMENT, AND PROJECTOR

The present application is based on, and claims priority from JP Application Serial Number 2020-143932, filed Aug. 27, 2020, the disclosure of which is hereby incorporated by reference herein in its entirety.

BACKGROUND

1. Technical Field

The present disclosure relates to a phosphor particle, a wavelength conversion element, a light source device, a method of manufacturing a phosphor particle, a method of manufacturing a wavelength conversion element, and a projector.

2. RELATED ART in the past, there has been known a method of increasing an absorptance by etching a surface of a single-crystal phosphor (see, e.g., JP-A-2017-137394 (Document 1)).

In an etching process described in Document 1, the surface of the single-crystal phosphor shaped like a particle is etched using hydrofluoric acid at 40° C. in concentration of 40%. In the single-crystal phosphor on which the hydrofluoric-acid treatment has been performed in such a manner, edges of each of the particles are rounded, and thus, curved surfaces increase compared to the single-crystal phosphor on which the hydrofluoric-acid treatment has not been performed. It is conceivable that by providing the surfaces of the particles of the single-crystal phosphor with curved surfaces, reflection of light by the surface is reduced to increase the absorptance, and thus, the emission intensity of the single-crystal phosphor shaped like a particle is increased.

There is configured a projector which is provided with a phosphor-containing member which includes such a single-crystal phosphor, a laser diode which emits blue light entering the phosphor-containing member, and a liquid crystal panel, and which projects an image using white light consisting of fluorescence having a yellow color and emitted from the phosphor-containing member, and the blue light which is not absorbed but is transmitted by the phosphor-containing member.

However, in the single-crystal phosphor on which the etching treatment has been performed and which is described in Document 1, since the convexly curved surface is provided to the surface of the particle, it is conceivable that it becomes difficult for the phosphor generated in the single-crystal phosphor shaped like a particle to be emitted outside from the single-crystal phosphor. In this case, there is a problem that it is difficult for the intensity of the fluorescence to be emitted from the phosphor-containing member to become high.

SUMMARY

A phosphor particle according to a first aspect of the present disclosure is a phosphor particle configured to emit fluorescence longer in wavelength than excitation light entering the phosphor particle, and includes a concave portion which is no smaller than 0.1 times as large as the wavelength of the fluorescence and no larger than 10 times as large as the wavelength of the fluorescence, the concave portion being disposed on a surface.

A wavelength conversion element according to a second aspect of the present disclosure includes a phosphor layer including a plurality of the phosphor particles, the phosphor layer further including a binder configured to bind a part of a surface of one of the phosphor particles adjacent to each other out of the plurality of the phosphor particles and a part of a surface of another of the phosphor particles to each other, and a substrate provided with the phosphor layer, wherein the binder includes glass.

A light source device according to a third aspect of the present disclosure includes the wavelength conversion element described above, and a light source configured to emit excitation light which enters the wavelength conversion element.

A method of manufacturing a phosphor particle according to a fourth aspect of the present disclosure is a method of manufacturing a phosphor particle configured to emit fluorescence longer in wavelength than excitation light entering the phosphor particle, and includes forming, on a surface of the phosphor particle, a concave portion which is no smaller than 0.1 times as large as the wavelength of the fluorescence and no larger than 10 times as large as the wavelength of the fluorescence.

A method of manufacturing a wavelength conversion element according to a fifth aspect of the present disclosure is a method of manufacturing a wavelength conversion element having a phosphor layer, including preparing a mixture obtained by mixing phosphor particles manufactured by the method of manufacturing the phosphor particle and a binder including glass with each other, applying the mixture to a substrate, and calcining the mixture applied to the substrate at a calcination temperature 100° C. or more higher than a softening point of the glass.

A method of manufacturing a wavelength conversion element according to a sixth aspect of the present disclosure is a method of manufacturing a wavelength conversion element having a phosphor layer, including preparing a mixture obtained by mixing phosphor particles manufactured by the method of manufacturing the phosphor particle and a binder including glass with each other, applying the mixture to a substrate, and calcining the mixture so that a viscosity of the glass takes a value no higher than $10^6$ dPa·s.

A wavelength conversion element according to a seventh aspect of the present disclosure is an element manufactured by the method of manufacturing the wavelength conversion element according to one of the fifth aspect and the sixth aspect.

A light source device according to an eighth aspect of the present disclosure includes the wavelength conversion element according to the seventh aspect described above, and a light source configured to emit excitation light which enters the wavelength conversion element.

A projector according to a ninth aspect of the present disclosure includes the light source device according to one of the third aspect and the eighth aspect, a light modulation device configured to modulate light emitted from the light source device in accordance with image information, and a projection optical device configured to project the light modulated by the light modulation device.

DESCRIPTION OF AN EXEMPLARY EMBODIMENT

An embodiment of the present disclosure will hereinafter be described based on the drawings.

Schematic Configuration of Projector

Figure 1:
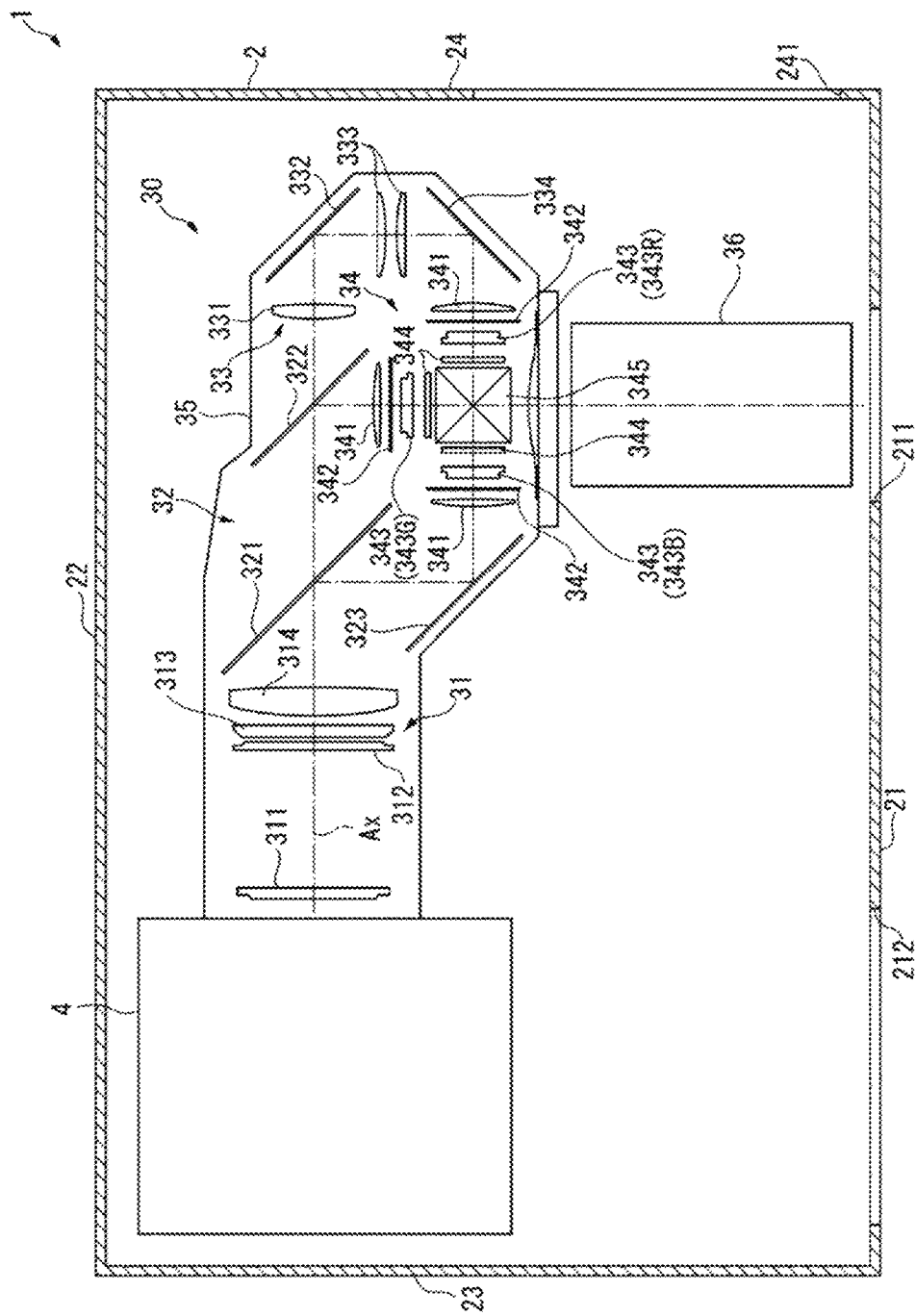
FIG. 1 is a schematic diagram showing a configuration of a projector according to an embodiment.

FIG. 1 is a schematic diagram showing a configuration of a projector 1 according to the present embodiment.

The projector 1 according to the present embodiment modulates the light emitted from a light source device 4 described later to project image light for forming an image corresponding to image information on a projection target surface such as a screen in an enlarged manner. As shown in FIG. 1, the projector 1 is provided with an exterior housing 2 forming an exterior, and the light source device 4 and an optical device 30 disposed inside the exterior housing 2. It should be noted that a configuration of the light source device 4 and the optical device 30 will be described later in detail. Besides the above, although not shown in the drawing, the projector 1 is provided with a control device for controlling an operation of the projector 1, a power supply device for supplying electronic components with electrical power, and a cooling device for cooling a cooling target.

Configuration of Exterior Housing

The exterior housing 2 configures an exterior of the projector 1. The exterior housing 2 houses the light source device 4, the optical device 30, the control device, the power supply device, and the cooling device. The exterior housing 2 has a top surface part and a bottom surface part each not shown, a front surface part 21, a back surface part 22, a left side surface part 23, and a right side surface part 24, and is formed to have a substantially rectangular solid shape.

The front surface part 21 has an opening part 211 for exposing a part of a projection optical device 36 described later, and the image light to be projected by the projection optical device 36 passes through the opening part 211. Further, the front surface part 21 has an exhaust port 212 from which a cooling gas having cooled the cooling target in the projector 1 is discharged to the outside of the exterior housing 2. Further, the right side surface part 24 has an introduction port 241 from which a gas located outside the exterior housing 2 is introduced inside as the cooling gas.

Configuration of Optical Device

The optical device 30 constitutes an image projection device for forming and then projecting the image corresponding to the image information. The optical device 30 is provided with a homogenizing device 31, a color separation device 32, a relay device 33, an image forming device 34, an optical component housing 35, and the projection optical device 36.

The homogenizing device 31 homogenizes the light emitted from the light source device 4. The light thus homogenized by the homogenizing device 31 illuminates modulation areas of light modulation devices 343 described later of the image forming device 34 via the color separation device 32 and the relay device 33. The homogenizing device 31 is provided with two lens arrays 311, 312, a polarization conversion element 313, and a superimposing lens 314.

The color separation device 32 separates the light having entered the color separation device 32 from the homogenizing device 31 into colored light beams of red, green, and blue. The color separation device 32 is provided with two dichroic mirrors 321, 322 and a reflecting mirror 323 for reflecting the blue light beam having been separated by the dichroic mirror 321.

The relay device 33 is disposed in a light path of the red light beam longer than a light path of the blue light beam and a light path of the green light beam to suppress a loss of the red light beam. The relay device 33 is provided with an incident side lens 331, relay lenses 333, and reflecting mirrors 332, 334.

It should be noted that although the relay device 33 is disposed in the light path of the red light beam, this is not a limitation, and it is also possible to adopt a configuration in which, for example, the colored light beam longer in light path than other colored light beams is set to the blue light beam, and the relay device 33 is disposed in the light path of the blue light beam.

The image forming device 34 modulates each of the colored light beams of red, green, and blue having entered the image forming device 34, and combines the colored light beams thus modulated with each other to form the image light to be projected by the projection optical device 36. The image forming device 34 is provided with three field lenses 341, three incident side polarization plates 342, three light modulation devices 343, and three exit side polarization plates 344 each disposed in accordance with the respective colored light beams entering the image forming device 34, and a single color combining device 345.

The light modulation devices 343 each modulate the light emitted from the light source device 4 in accordance with the image information. The light modulation devices 343 include the light modulation device 343R for modulating the red light beam, the light modulation device 343G for modulating the green light beam, and the light modulation device 343B for modulating the blue light beam. In the present embodiment, the light modulation devices 343 are each formed of a transmissive liquid crystal panel, and the incident side polarization plate 342, the light modulation device 343, and the exit side polarization plate 344 constitute a liquid crystal light valve.

The color combining device 345 combines the colored light beams respectively modulated by the light modulation devices 343B, 343G, and 343R with each other to form the image light described above. In the present embodiment, the color combining device 345 is formed of a cross dichroic prism, but this is not a limitation, and it is also possible for the color combining device 345 to be constituted by, for example, a plurality of dichroic mirrors.

The optical component housing 35 houses the homogenizing deice 31, the color separation device 32, the relay deice 33, and the image forming device 34 each described above inside. It should be noted that an illumination light axis Ax as a design optical axis is set in the optical device 30, and the optical component housing 35 holds the homogenizing device 31, the color separation device 32, the relay device 33, and the image forming device 34 at predetermined positions on the illumination light axis Ax. The light source device 4 and the projection optical device 36 are disposed at predetermined positions on the illumination light axis Ax.

The projection optical device 36 projects the image light entering the projection optical device 36 from the image forming device 34 on the projection target surface in an enlarged manner. In other words, the projection optical device 36 projects the light beams having respectively been modulated by the light modulation devices 343B, 343G, and 343R. The projection optical device 36 is configured as a combination lens having, for example, a plurality of lenses housed in a lens tube having a cylindrical shape.

Configuration of Light Source Device

Figure 2:
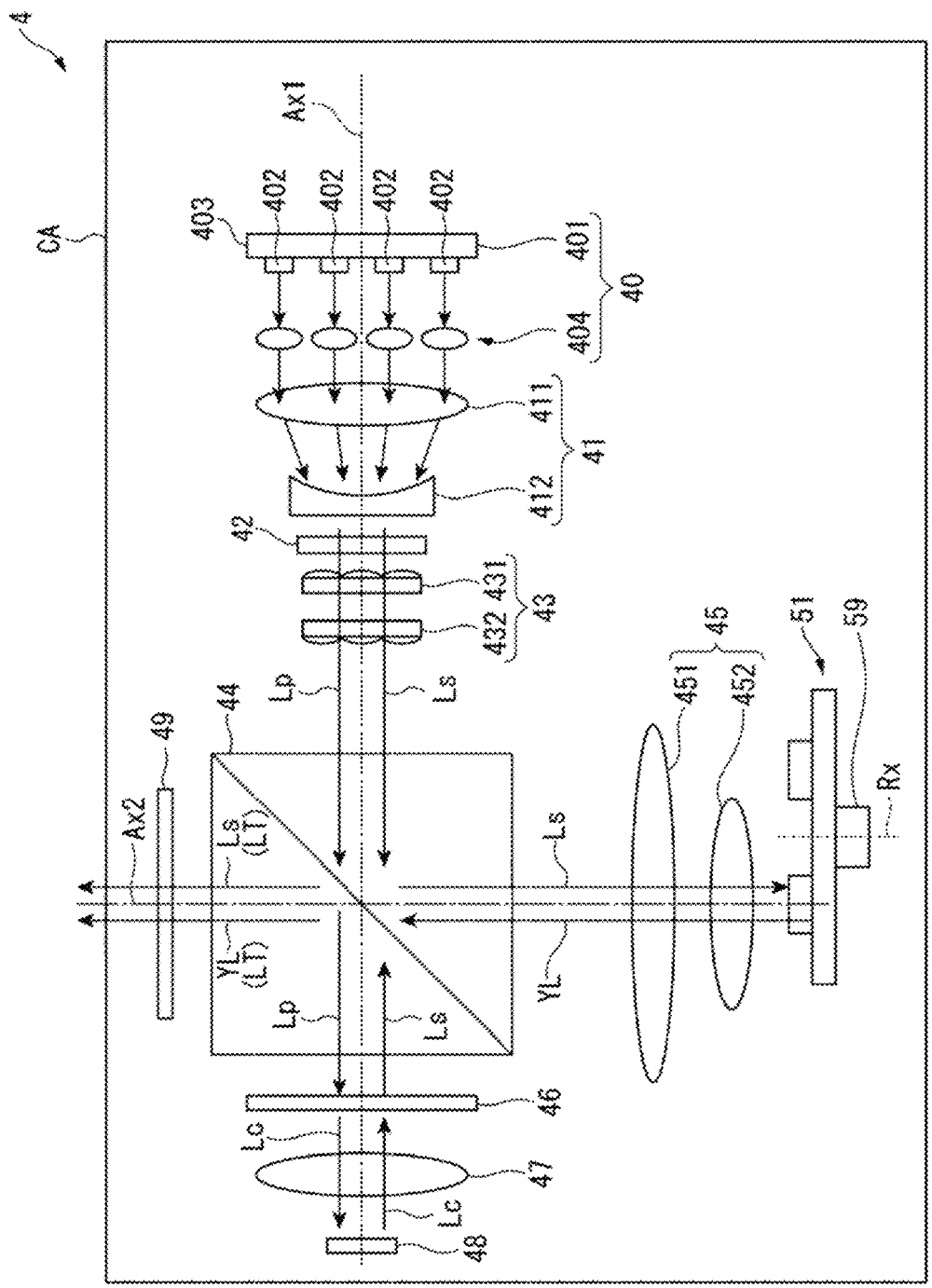
FIG. 2 is a schematic diagram showing a configuration of a light source device according to the embodiment.

FIG. 2 is a schematic diagram showing the light source device 4.

The light source device 4 emits illumination light LT for illuminating the light modulation devices 343 to the homogenizing device 31. As shown in FIG. 2, the light source device 4 is provided with a light source housing CA, and a light source section 40, an afocal optical element 41, a first retardation element 42, a homogenizer optical element 43, a light split element 44, a first light collection element 45, a second retardation element 46, a second light collection element 47, a diffusely reflecting device 48, a third retardation element 49, a wavelength conversion device 51, and a rotating device 59 housed in the light source housing CA.

The light source housing CA is a sealed housing difficult for dust or the like to enter the inside of the sealed housing.

The light source section 40, the afocal optical element 41, the first retardation element 42, the homogenizer optical element 43, the light split element 44, the second retardation element 46, the second light collection element 47, and the diffusely reflecting device 48 are disposed on an illumination light axis Ax1 set in the light source device 4.

The wavelength conversion element 51, the first light collection element 45, the light split element 44, and the third retardation element 49 are disposed on an illumination light axis Ax2 which is set in the light source device 4, and is perpendicular to the illumination light axis Ax1.

Configuration of Light Source Section

The light source section 40 is provided with a light source 401 for emitting the light, and collimator lenses 404.

The light source 401 is provided with a plurality of solid-state light sources 402, and a support member 403.

The solid-state light sources 402 are each a light emitting element for emitting a blue light beam which is s-polarized light as excitation light. In the detailed description, the solid-state light sources 402 are each a semiconductor laser, and the blue light beam emitted by each of the solid-state light sources 402 is a laser beam having a peak wavelength of, for example, 440 nm.

The support member 403 supports the plurality of solid-state light sources 402 arranged in an array on a plane perpendicular to the illumination light axis Ax1. The support member 403 is a metallic member having thermal conductivity.

The blue light beams having been emitted from the plurality of solid-state light sources 402 are converted by the collimator lenses 404 into parallel light beams, and then enter the afocal optical element 41.

It should be noted that in the present embodiment, the light source 401 emits the blue light beams which are linearly polarized light beams the same in polarization direction. However, this is not a limitation, and the light source 401 can also be provided with a configuration of emitting blue light beams as s-polarized light and the blue light beams as p-polarized light. In this case, the first retardation element 42 can be omitted.

Configuration of Afocal Optical Element

The afocal optical element 41 adjusts the light flux diameter of the blue light beams which enter the afocal optical element 41 from the light source section 40. The afocal optical element 41 is constituted by a lens 411 for collecting the incident light, and a lens 412 for collimating the light beams collected by the lens 411. It should be noted that the afocal optical element 41 can be eliminated.

Configuration of First Retardation Element

The first retardation element 42 is disposed between the afocal optical element 41 and the homogenizer optical element 43. The first retardation element 42 converts the linearly polarized light of the single kind having entered the first retardation element 42 into light including blue light beam Ls as the s-polarized light and blue light beam Lp as the p-polarized light. The first retardation element 42 can be rotated by the rotating device centering on a rotational axis along the illumination light axis Ax1. In this case, the ratio between the blue light beam Ls and the blue light beam Lp in the light beam emitted from the first retardation element 42 can be adjusted in accordance with a rotational angle of the first retardation element 42.

Configuration of Homogenizer Optical Element.

The homogenizer optical element 43 homogenizes an illuminance distribution of the blue light beams Ls, Lp entering the homogenizer optical element 43 from the afocal optical element 41 via the first retardation element 42. The homogenizer optical element 43 is formed of a pair of multi-lens arrays 431, 432.

It should be noted that it is possible to adopt a diffusely transmitting element which diffuses the incident light in the process of transmitting the incident light to thereby homogenize the illuminance distribution of the light emitted instead of the homogenizer optical element 43. As the diffusely transmitting element, it is possible to illustrate a configuration having a hologram, a configuration in which a plurality of small lenses arranged on a plane perpendicular to the light axis, and a configuration in which the surface through which the light passes is a coarse surface.

Configuration of Polarization Split Element

The blue light beams Ls, Lp having passed through the homogenizer optical element 43 enter the light split element 44.

The light split element 44 is a prism-type polarization beam splitter, and separates an s-polarization component and a p-polarization component included in the incident light from each other. Specifically, the light split element 44 reflects the s-polarization component, and transmits the p-polarization component. Further, the light split element 44 has a color separation characteristic of transmitting light with the wavelength no shorter than a predetermined wavelength irrespective of whether the polarization component is the s-polarization component or the p-polarization component. Therefore, the blue light beam Ls as the s-polarized light is reflected by the light split element 44, and then enters the first light collection element 45. Meanwhile, the blue light beam Lp as the p-polarized light is transmitted through the light split element 44, and then enters the second retardation element 46.

It should be noted that it is possible for the light split element 44 to have a function of a half mirror which transmits a part of light entering the half mirror from the light source section 40 via the homogenizer optical element 43, and reflects the rest of the light, and a function of a dichroic mirror which reflects the blue light entering the dichroic mirror from the diffusely reflecting device 48, and transmits light entering the dichroic mirror from the wavelength conversion element 51 and having a wavelength longer than the wavelength of the blue light. In this case, the first retardation element 42 can be omitted.

Configuration of First Light Collection Element

The first light collection element 45 converges the blue light beam Ls having been reflected by the light split element 44 on the wavelength conversion element 51. Further, the first light collection element 45 collimates fluorescence YL entering the first light collection element 45 from the wavelength conversion element 51. Although the first light collection element 45 is constituted by two lenses 451, 452 in the example shown in FIG. 2, the number of the lenses constituting the first light collection element 45 does not matter.

Configuration of Wavelength Conversion Element

The wavelength conversion element 51 converts the wavelength of the incident light. Specifically, the wavelength conversion element 51 is excited by the blue light beam Ls as the excitation light entering the wavelength conversion element 51, and then emits the fluorescence YL having the wavelength longer than the wavelength of the blue light beam Ls having entered the wavelength conversion element 51. The fluorescence YL is, for example, light having a peak wavelength in a range of 500 through 700 nm. In other words, the fluorescence YL includes green light and red light.

The rotating device 59 rotates the wavelength conversion element 51 as a phosphor wheel at a constant speed in a constant direction centering on a rotational axis parallel to the illumination light axis Ax2 under the control of the control device. The rotating device 59 can be configured by, for example, a motor.

The fluorescence YL having been emitted from the wavelength conversion element 51 passes through the first light collection element 45 along the illumination light axis Ax2, and then enters the light split element 44. Then, the fluorescence YL passes through the light split element 44 along the illumination light axis Ax2, and then enters the third retardation element 49.

It should be noted that the configuration of the wavelength conversion element 51 will be described later in detail.

Configuration of Second Retardation Element and Second Light Collection Element

The second retardation element 46 is disposed between the light split element 44 and the second light collection element 47. The second retardation element 46 converts the blue light beam Lp having passed through the light split element 44 into a blue light beam Lc as circularly polarized light. The blue light beam Lc enters the second light collection element 47.

The second light collection element 47 converges the blue light beam Lc entering the second light collection element 47 from the second retardation element 46 on the diffusely reflecting device 48. Further, the second light collection element 47 collimates the blue light beam Lc entering the second light collection element 47 from the diffusely reflecting device 48. It should be noted that the number of lenses constituting the second light collection element 47 can arbitrarily be changed.

Configuration of Diffusely Reflecting Device

The diffusely reflecting device 48 reflects and diffuses the blue light beam Lc entering the diffusely reflecting device 48 at substantially the same diffusion angle as that of the fluorescence YL emitted from the wavelength conversion element 51. The diffusely reflecting device 48 has a reflecting member for causing Lambertian reflection of the blue light beam Lc having entered the diffusely reflecting device 48. It should be noted that it is possible for the diffusely reflecting device 48 to be provided with a rotating device for rotating a reflecting member centering on a rotational axis parallel to the illumination light axis Ax1.

The blue light beam Lc having diffusely been reflected by the diffusely reflecting device 48 passes through the second light collection element 47, and then enters the second retardation element 46. The blue light beam Lc is converted into circularly polarized light with the opposite rotational direction when reflected by the diffusely reflecting device 48. Therefore, the blue light beam Lc entering the second retardation element 46 via the second light collection element 47 is converted by the second retardation element 46 into the blue light beam Ls as the s-polarized light. Then, the blue light beam Ls is reflected by the light split element 44 to enter the third retardation element 49. Therefore, the light which enters the third retardation element 49 from the light split element 44 is white light having the blue light beam Ls and the fluorescence YL mixed with each other.

Configuration of Third Retardation Element

The third retardation element 49 converts the white light entering the third retardation element 49 from the light split element 44 into light having the s-polarized light and the p-polarized light mixed with each other. The illumination light LT as the white light having been converted in such a manner enters the homogenizing device 31 described above.

Configuration of Wavelength Conversion Element

Figure 3:
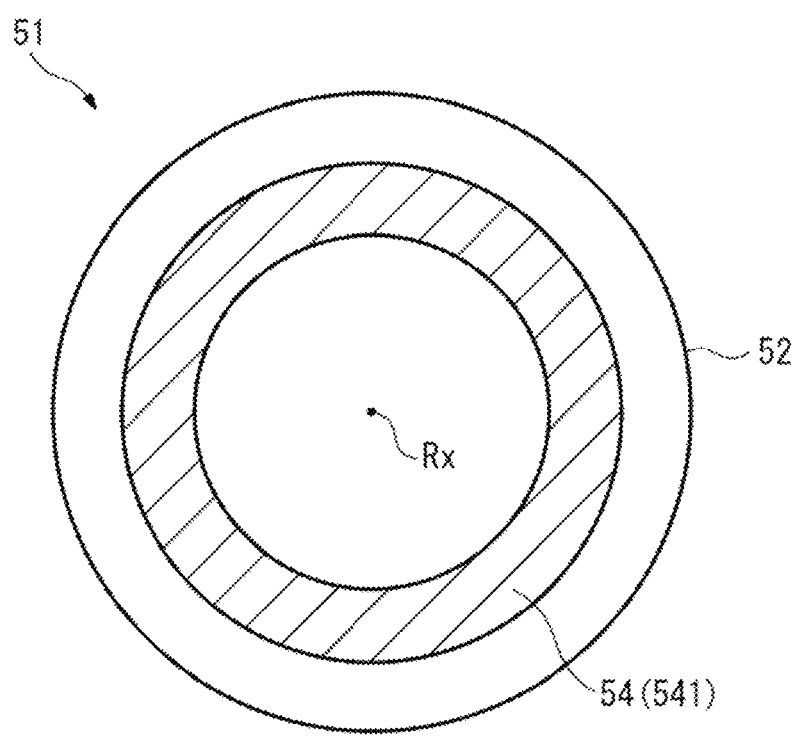
FIG. 3 is a plan view of a wavelength conversion element according to the embodiment viewed from an incident side of excitation light.
Figure 4:
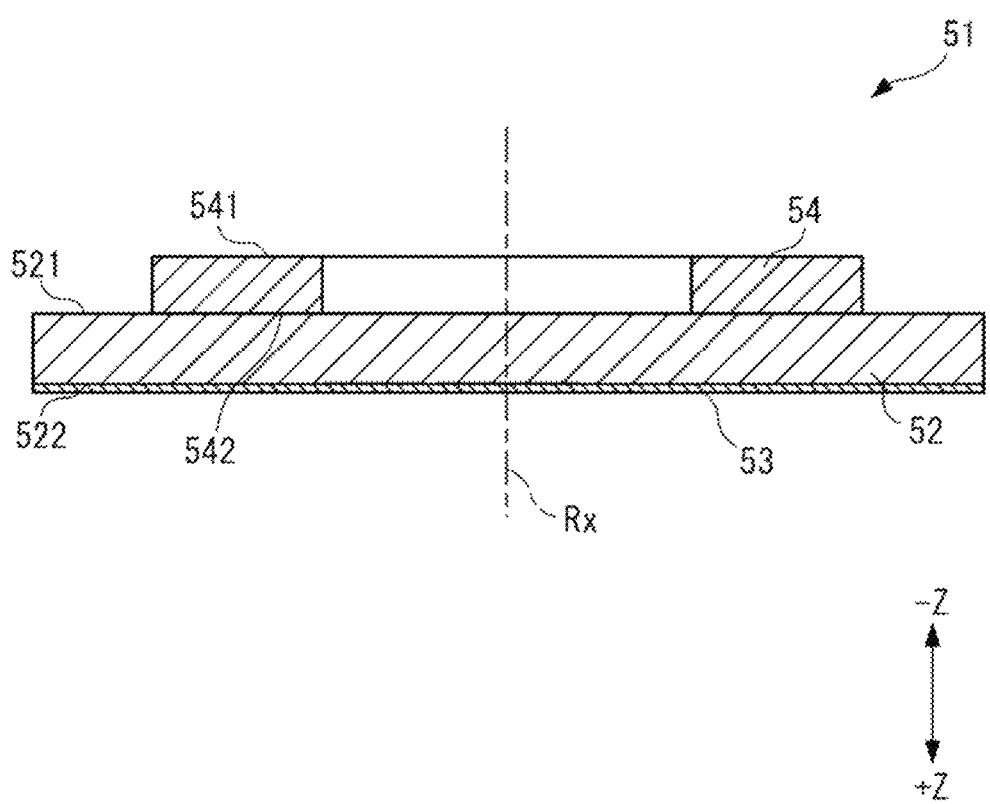
FIG. 4 is a schematic diagram showing a cross-sectional surface of the wavelength conversion element according to the embodiment.

FIG. 3 is a plan view of the wavelength conversion element 51 viewed from the incident side of the excitation light. FIG. 4 is a diagram schematically showing a cross-sectional surface of the wavelength conversion element 51.

The wavelength conversion element 51 is a reflective wavelength conversion element for emitting the fluorescence as the light having a different wavelength from the wavelength of the excitation light toward the incident side of the excitation light. As shown in FIG. 3 and FIG. 4, the wavelength conversion element 51 has a substrate 52, a radiator sheet 53, and a phosphor layer 54. It should be noted that the wavelength conversion element 51 is manufactured using a manufacturing method described later.

It should be noted that in the following description and the drawings, the blue light beam Ls which enters the phosphor layer 54 is described as excitation light for exciting the phosphor particles included in the phosphor layer 54. Further, the incident direction of the excitation light to the phosphor layer 54 is defined as a +Z direction, and an opposite direction to the +Z direction is defined as a −Z direction.

Configuration of Substrate

The substrate 52 is a holding member for holding the radiator sheet 53 and the phosphor layer 54, and in addition, the substrate 52 is also a radiator member for radiating the heat transferred from the phosphor layer 54. As shown in FIG. 3, the substrate 52 is formed of, for example, a metal material including at least either of alumina and zinc oxide so as to have a disk-like shape when viewed from the −Z direction. The substrate 52 is rotated together with the radiator sheet 53 and the phosphor layer 54 centering on the rotational axis Rx along the illumination light axis Ax2 by the rotating device 59.

As shown in FIG. 4, the substrate 52 has a first surface 521 as a surface at the −Z direction side, and a second surface 522 as a surface at the +Z direction side.

The first surface 521 is an opposed surface opposed to the phosphor layer 54, and is a reflecting surface for reflecting the incident light.

The second surface 522 is a surface at the opposite side to the first surface 521. To the second surface 522, there is bonded the radiator sheet 53, the heat generated in the phosphor layer 54 is transferred to the radiator sheet 53 via the substrate 52, and heat having been transferred is transferred to the entire area of the radiator sheet 53. The radiator sheet 53 increases the contact area with the ambient gas to thereby increase the radiation efficiency of the heat having been transferred to the substrate 52. The radiator sheet 53 is formed of, for example, aluminum or graphite. It should be noted that it is possible to dispose a radiator fin for releasing the heat transferred to the substrate 52 instead of the radiator sheet 53.

The substrate 52 is a sintered body obtained by calcining alumina powder having a submicron size at low temperature to include microscopic gas pockets as much as about 20% in volume, and reflects the light which enters the substrate 52 from the phosphor layer 54 with the first surface 521 toward the phosphor layer 54. However, this is not a limitation, and the substrate 52 can be a metallic substrate provided with a reflecting layer disposed on the first surface 521.

Configuration of Phosphor Layer

The phosphor layer 54 is disposed at the −Z direction side as the incident side of the excitation light with respect to the substrate 52. The phosphor layer 54 converts the excitation light entering the phosphor layer 54 into fluorescence, and then emits the fluorescence. In other words, the phosphor layer 54 performs the wavelength conversion on the excitation light entering the phosphor layer 54 to generate and then emit the fluorescence as the light having a longer wavelength than the wavelength of the excitation light. As shown in FIG. 3, the phosphor layer 54 is formed to have a substantially ring-like shape centering on the rotational axis Rx of the wavelength conversion element 51 when viewed from the −Z direction.

As shown in FIG. 4, the phosphor layer 54 has a first surface 541 as a surface at the −Z direction side, and a second surface 542 as a surface at the +Z direction side, and a surface at an opposite side to the first surface 541.

The first surface 541 is a plane of incidence which the excitation light enters, and is an exit surface from which the fluorescence is emitted. The second surface 542 is an opposed surface opposed to the substrate 52.

Figure 5:
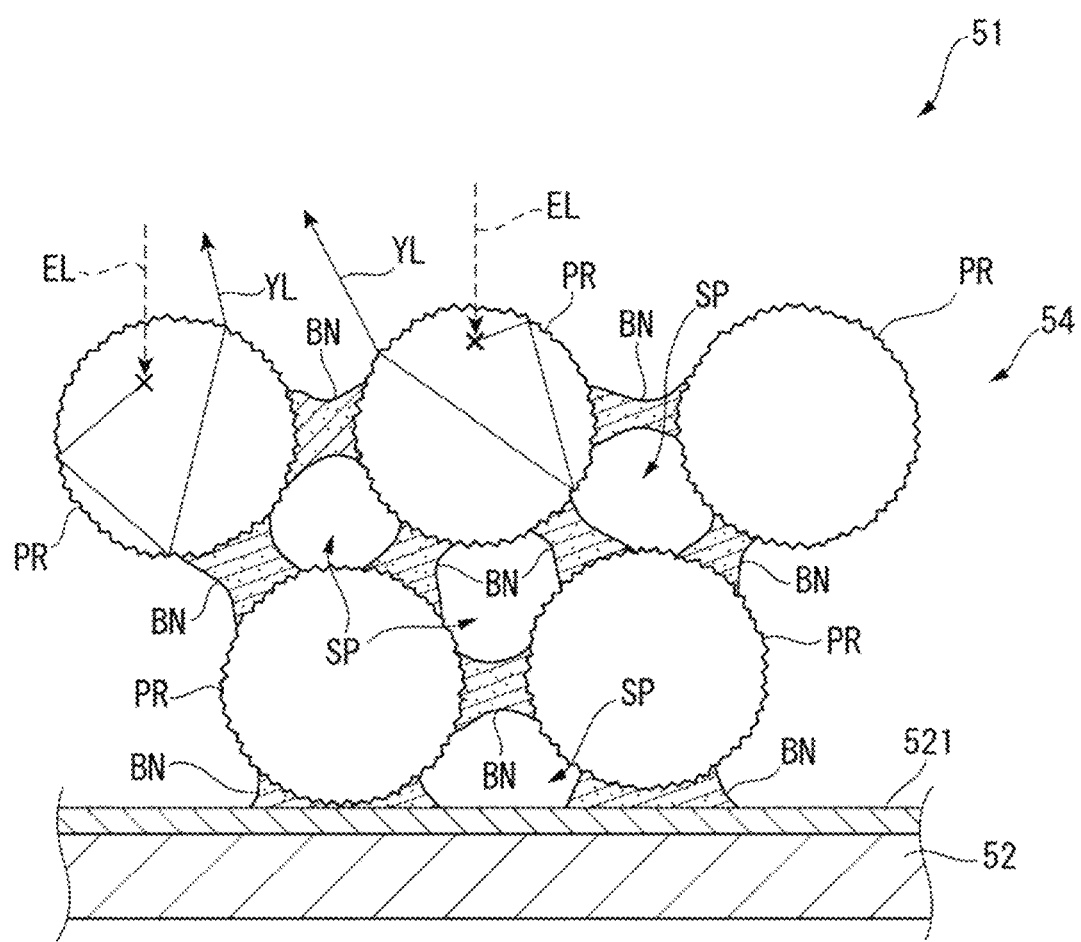
FIG. 5 is a cross-sectional view showing a part of the wavelength conversion element according to the embodiment in an enlarged manner.

FIG. 5 is a cross-sectional view showing a part of the wavelength conversion element 51 in an enlarged manner. It should be noted that in FIG. 5, the excitation light EL is represented by dotted arrows, and the fluorescence YL is represented by solid arrows.

The phosphor layer 54 includes a plurality of phosphor particles PR, and a binder BN configured to bind one of the phosphor particles PR adjacent to each other out of the plurality of phosphor particles PR and another of the phosphor particles PR adjacent to each other. Further, in the phosphor layer 54, there are disposed voids SP. In other words, the phosphor layer 54 has a configuration in which the phosphor particles PR are bound to each other with the binder BN, and the voids SP are disposed inside. The binder BN binds the phosphor particles PR to each other.

Figure 6:
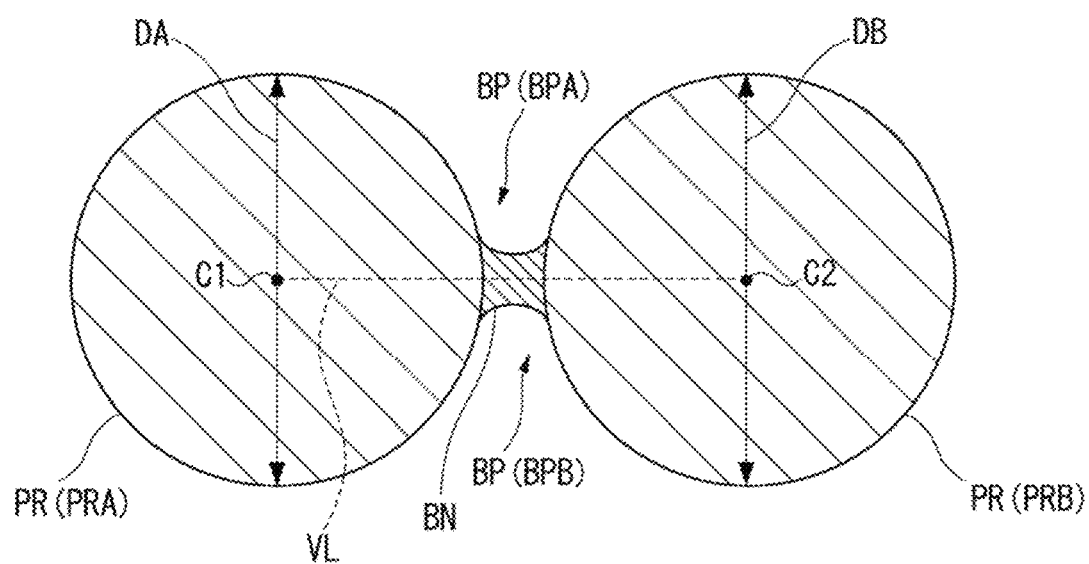
FIG. 6 is a schematic diagram showing a binding state of phosphor particles with a binder in the embodiment.
Figure 6:
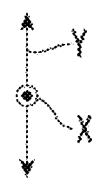

FIG. 6 is a schematic diagram showing the phosphor particles PR (PRA, PRB) bound to each other with the binder BN.

As shown in, for example, FIG. 6, the two phosphor particles PR (PRA, PRB) adjacent to each other are bound to each other with the binder BN partially binding the surfaces of the respective phosphor particles.

The phosphor particles PR are each a particle including a phosphor material and an activator agent to be the light emission center. As the activator agent, there can be cited, for example, Ce, Eu, Pr, Cr, Gd, and Ga. As the phosphor material, there can be adopted a YAG phosphor material, a phosphor material obtained by replacing Y in the YAG phosphor with Lu or Gd, and replacing Al with Ga, a Y(AlGa)G phosphor material, a GdYAG phosphor material, a KSF phosphor material, a lanthanum silicon nitride phosphor material, an SCASN phosphor material, a CASN phosphor material, and so on. The phosphor material can also be a mixture of a plurality of phosphor materials.

As the binder BN, there is used borosilicate glass in the present embodiment, but phosphate glass can also be adopted. Further, there can also be used polysilazane consisting primarily of $SiO_2$. It should be noted that the binder BN binds the phosphor layer 54 and the substrate 52 to each other when calcining the mixture including the phosphor particles PR and the binder BN to form the phosphor layer 54.

As described above, inside the phosphor layer 54, there are disposed the microscopic voids SP. Since such voids SP are included, the spread of the fluorescence inside the phosphor layer 54 is suppressed, and by taking out the fluorescence from the phosphor layer 54 in a small range, the light collection efficiency of the optical system can be increased.

The binding part with the binder BN in the phosphor particle PR is hereinafter defined as a binding part BP. For example, the binding part with the binder BN in the phosphor particle PRA is defined as the binding part BP (BPA), and the binding part with the binder BN in the phosphor particle PRB is defined as the binding part BP (BPB).

Relationship Between Area of Binding Part in Phosphor Particle and Brightness in Optical System The light source device 4 adopted in the projector 1 is required to be a light source device in which the brightness of the light transmitted through the optical device 30 as an optical system which the illumination light emitted from the light source device 4 enters becomes high.

Therefore, in the present embodiment, the area of the binding part BP with the binder BN on the surface of the phosphor particle PR included in the phosphor layer 54 located at the exit side of the fluorescence YL is adjusted. Specifically, in order to increase the brightness of the light transmitted through the optical device 30, the area of the binding part BP is set to a value no higher than 10% of the surface area of the phosphor particle PR. In the detailed description, the area of the binding part BP is set to a value within a range no lower than 3% and no higher than 5% of the surface area of the phosphor particle PR. This derives from the following experimental result.

Figure 7:
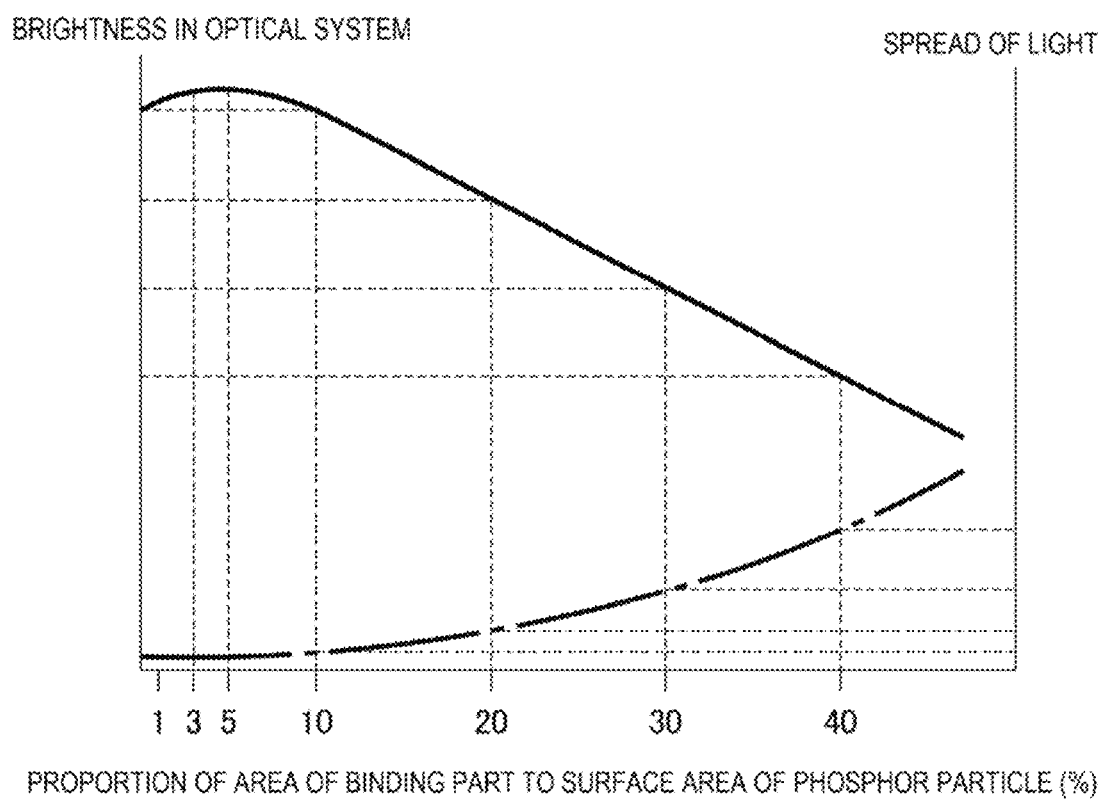
FIG. 7 is a graph showing brightness in an optical system and spread of light with respect to the area of the binding part in the embodiment.

FIG. 7 is a graph showing the brightness in the optical system in the optical device 30 and the spread of the light with respect to the proportion of the area of the binding part BP to the surface area of the phosphor particle PR.

The inventors conducted an experiment of measuring the spread of the light emitted from the phosphor layer 54 and the brightness in the optical system in the optical device 30 while changing the proportion of the area of the binding part BP to the surface area of the phosphor particle PR. It should be noted that the brightness in the optical system mentioned here represents the intensity of the light which can be converged on the light modulation devices 343. Further, the spread of the light is a proportion of the area of the exit region of the fluorescence to the area of the incident region of the excitation light in the phosphor layer 54. In the following description, the proportion of the area of the binding part BP to the surface area of the phosphor particle PR is abbreviated as an area proportion.

The higher the area proportion was, the broader the spread of the light emitted from the phosphor layer 54 became as represented by the dashed-dotted line in FIG. 7. In other words, the larger the area of the binding part BP was, the broader the spread of the light emitted from the phosphor layer 54 became.

As represented by the solid line in FIG. 7, it was found out that it was not true that the lower the area proportion was, the higher the brightness in the optical system became, but there existed the maximum value (the highest value) in the brightness in the optical system.

In the detailed description, in the range in which the area proportion was no higher than 10%, the brightness in the optical system increased and then decreased as the area proportion increased. Further, it was found out that the maximum value of the brightness in the optical system appeared when the area proportion was in the range of no lower than 3% and no higher than 5%.

In contrast, in a range in which the area proportion exceeded 10%, the brightness in the optical system was lower than the value corresponding to the area proportion of 0%, and the higher the area proportion was, the lower the brightness in the optical system became.

In other words, it was found out that the brightness in the optical system became higher when the area proportion was no higher than 10% than the value when the area proportion was 0%, and took the maximum value when the area proportion was in the range of no lower than 3% and no higher than 5%.

It is conceivable that the reason that there exists the range of the area proportion in which the brightness in the optical system takes the high value as described above is as follows.

The refractive index of the phosphor particles PR formed of the YAG phosphor material is about 1.8. In contrast, the refractive index of the borosilicate glass constituting the binder BN is about 1.5.

Therefore, the fluorescence having been generated inside the phosphor particle PR and then entered the binding part BP propagates the binder BN from the binding part BP to proceed to the inside of the adjacent phosphor particle PR.

In contrast, since the voids SP are disposed inside the phosphor layer 54, other areas than the binding part BP has contact with air on the outside surface of each of the phosphor particles PR included in the phosphor layer 54. Therefore, in accordance with the Fresnel formula, the fluorescence which is generated inside the phosphor particle PR and then enters the other areas than the binding part BP on the outside surface of the phosphor particle PR is mostly refracted and then emitted outside the phosphor particle PR and partially reflected inside the phosphor particle PR, or is totally reflected inside the phosphor particle PR.

When the area proportion is high, the amount of the fluorescence entering the binding part BP increases. In other words, when the area proportion is high, the amount of the fluorescence propagating the binder BN via the binding part BP increases. In this case, since a difference between the refractive index of the phosphor particles PR and the refractive index of the binder BN is small, and the refraction on the interface between the phosphor particle PR and the binder BN is small, the fluorescence becomes apt to spread to the neighboring phosphor particles PR. Therefore, the fluorescence goes out from the phosphor layer 54 to the outside as a light source broad in spread. Thus, the fluorescence having been emitted from the phosphor layer 54 becomes difficult to be converged on the light modulation devices 343 of the optical device 30 as the optical system. In other words, in this case, the brightness in the optical system lowers.

When the area proportion is low, the fluorescence generated inside the phosphor particle PR becomes easy to enter the other areas than the binding part BP on the outside surface of the phosphor particle PR, namely the interface with the air. Therefore, since the intensity of the fluorescence which is refracted on the interface between the phosphor particle PR and the air, and is then emitted from the phosphor particle PR, and the intensity of the fluorescence which is totally reflected increase, the fluorescence is prevented from spreading to the phosphor particles PR in a neighboring broad range, and the fluorescence goes out as the light source small in spread to the outside from the phosphor layer 54. Such fluorescence is apt to converge on the light modulation devices 343. In other words, in this case, the brightness in the optical system rises.

In contrast, when the area proportion has such an extremely small value as, for example, a value no higher than 1%, the fluorescence becomes apt to be confined inside the phosphor particle PR. In this case, the reflection of the fluorescence on the interface with the air becomes apt to be repeated, and thus, the light path length of the fluorescence increases. As described above, by the fluorescence passing through the phosphor particle PR many times, self-absorption becomes apt to occur. The self-absorption is a phenomenon that the phosphor absorbs the fluorescence to generate heat since the emission wavelength of the phosphor partially overlaps the absorption wavelength of the phosphor. When such self-absorption occurs, the intensity of the fluorescence emitted from the phosphor layer 54 decreases, and by extension, the brightness in the optical system decreases.

On the other hand, when the frequency of the reflection and the refraction on the interface with the air in the phosphor particle PR increases, the excitation light with which the phosphor particles PR are irradiated from the outside of the phosphor layer 54 becomes apt to be reflected by the surface of each of the phosphor particles PR, or the inside of each of the phosphor particles PR. The intensity of the excitation light which is radiated outside the phosphor layer 54 without being converted into the fluorescence increases. In other words, backward scattering (backscatter) of the excitation light becomes apt to occur. In this case, by the intensity of the excitation light to be converted into the fluorescence decreasing, the intensity of the fluorescence emitted from the phosphor layer 54 decreases, and by extension, the brightness in the optical system can decrease.

According to such a consideration, it has been understood that in order to increase the brightness in the optical system, the area proportion preferably has a value no higher than 10%, and more preferably has a value no lower than 3% and no higher than 5%.

Size of Binding Part to Binder in Phosphor Particle

In the present embodiment, in order to make the proportion of the area of the binding part BP to the surface area of the phosphor particle PR no higher than 10%, the phosphor layer 54 is manufactured so that the size of the binding part BP becomes the following size. It should be noted that as shown in FIG. 6, in the following description, the two axes which are perpendicular to an imaginary line VL connecting the centers C1, C2 of the respective phosphor particles PRA, PRE bound to each other with the binder BN, and are perpendicular to each other are defined as an X axis and a Y axis.

In the present embodiment, the dimension in the Y axis of the binding part BPA is made no larger than ¼ of the diameter DA of the phosphor particle PRA, and although not shown in the drawing, the dimension in the X axis of the binding part BPA is made no larger than ¼ of the diameter DA of the phosphor particle PRA. In other words, the dimension in the Y axis of the binding part EPA is made no larger than ¼ of the size in the Y axis of the phosphor particle PRA, and although not shown in the drawing, the dimension in the X axis of the binding part BPA is made no larger than ¼ of the size in the X axis of the phosphor particle PRA.

Similarly, the dimension in the Y axis of the binding part BPB is made no larger than ¼ of the diameter DB of the phosphor particle PRB, and although not shown in the drawing, the dimension in the X axis of the binding part BPB is made no larger than ¼ of the diameter DB of the phosphor particle PRB. In other words, the dimension in the Y axis of the binding part BPB is made no larger than ¼ of the size in the Y axis of the phosphor particle PRB, and although not shown in the drawing, the dimension in the X axis of the binding part BPB is made no larger than ¼ of the size in the X axis of the phosphor particle PRE.

Further, assuming the thickness dimension of the binder BN as the dimension of the binder BN along the imaginary line VL, the thickness dimension of the binder BN is made no larger than 1/10 of the diameter of the phosphor particle PR.

As described above, since the dimension of the binding part BP is the size described above, the proportion described above becomes the value no higher than 10%, and it is possible to increase the brightness in the optical system.

Calculational Size of Binding Part

The area proportion described above for increasing the brightness in the optical system is also supported by a calculation result based on the diameter of the phosphor particle PR.

When assuming that the phosphor particles PR included in the phosphor layer 54 each have a spherical shape, the surface area of the phosphor particle PR with a radius of R is $4\pi \cdot R^2$.

In contrast, when the phosphor particles PR each having a spherical shape and uniformed in particle diameter are densely arranged, the filling rate of the phosphor particles PR per unit volume is typically 60 through 75%. In this case, the number of other phosphor particles PR having contact with one phosphor particle PR is 8 through 12.

When the number of the other phosphor particles PR having contact with the one phosphor particle PR is assumed as 8, and the binder BN is assumed as a circular cylinder having a thickness of t and a radius of r, the total area of the binding part BP is $8\pi \cdot R^2$. It should be noted that the thickness of the binder BN is a dimension along the imaginary line VL shown in FIG. 6. Further, the thickness of the binder BN is preferably no larger than 1/10 of the phosphor particle PR.

According to the above, the area proportion described above is obtained as $8\pi \cdot r^2/(4\pi \cdot R^2)$. In other words, the area proportion described above becomes $2\ r^2/R^2$.

When assuming the radius R of the phosphor particle PR as 12 μm, and assuming the proportion of the binding part BP to the surface area of the phosphor particle PR as 5% (=0.05) based on the experimental result described above, the radius r of the binding part BP becomes about 1.89 μm. In other words, the radius r of the binding part BP when using a circle as the shape of the binding part BP in the phosphor particle PR becomes about 2 μm, and the diameter of the binding part BP becomes about 4 μm. Further, assuming the number of the other phosphor particles PR having contact with the one phosphor particle PR as 12, the radius r of the binding part BP becomes about 3 μm, and the diameter of the binding part BP becomes about 6 μm. Therefore, the radius r of the binding part BP is about 2 through 3 μm, and the diameter of the binding part BP is about 4 through 6 μm.

The diameter of the binding part BP obtained by such calculation is a value no larger than ¼ of the diameter 24 μm of the phosphor particle PR based on the assumption described above. In other words, the dimensions in the X axis and the Y axis of the binding part BP are each a value no larger than ¼ of the diameter of the phosphor particle PR.

As described hereinabove, by setting the dimension of the binding part BP to the size described above with respect to the diameter of the phosphor particle PR, it is possible to make the area proportion described above no higher than 10%, and by extension, it is possible to increase the brightness in the optical system.

The size of such a binding part BP can be achieved by adjusting the temperature when manufacturing the phosphor layer 54 although described later in detail. This point will be described in a method of manufacturing the wavelength conversion element 51.

Glass Content Rate in Phosphor Layer

Figure 8:
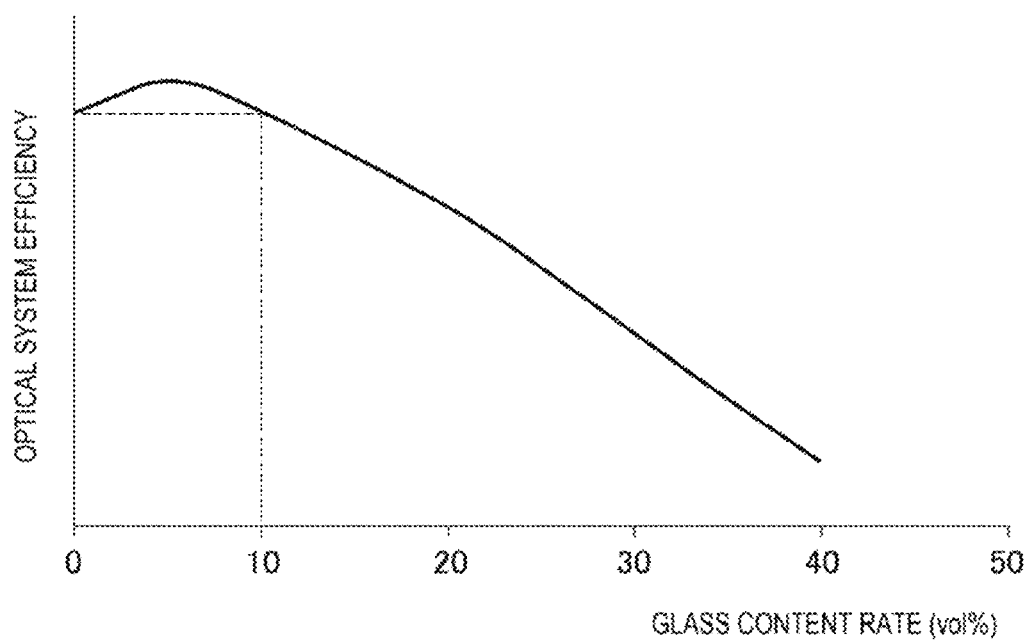
FIG. 8 is a graph showing a relationship between a glass content rate and optical system efficiency in the embodiment.

FIG. 8 is a graph showing a relationship between a glass content rate of the phosphor layer 54 and optical system efficiency.

It should be noted that the glass content rate is represented by volume percent (vol %) of the binder BN in the phosphor layer 54. Specifically, the glass content rate is "100*(volume of glass)/((volume of glass)+(volume of phosphor particles))," and the volume of the voids is not included.

In other words, the glass content rate mentioned here is not a measured value of the wavelength conversion element 51 after being manufactured, but is a value based on the volume percent of the input of the binder BN and the phosphor particles PR in a mixture preparation step S3 in the process of manufacturing the wavelength conversion element 51 described later.

In contrast, the optical system efficiency is "(the intensity of the light having been emitted from the phosphor layer 54, transmitted through the optical device 30 as the optical system, and then emitted from the projection optical device 36)/(the intensity of the excitation light with which the phosphor layer 54 has been irradiated)." Therefore, the optical system efficiency is neither "(the intensity of the light having been emitted from the phosphor layer 54 and then entered the optical device 30)/(the intensity of the excitation light with which the phosphor layer 54 has been irradiated)" nor the wavelength conversion efficiency expressed by "(the intensity of the light having been emitted from the phosphor layer 54)/(the intensity of the excitation light with which the phosphor layer 54 has been irradiated)."

in other words, the optical system efficiency is the efficiency including etendue, and can be rephrased as the light use efficiency in the optical device 30 of the projector 1.

As shown in FIG. 8, in the phosphor layer 54 related to the present embodiment, in a range in which the glass content rate is higher than 0 vol % and no higher than 10 vol %, the optical system efficiency is made higher compared to when the glass content rate is 0 vol %. Further, when the glass content rate is 10 vol %, the optical system efficiency takes substantially the same value as when the glass content rate is 0 vol %.

When the glass content rate of the phosphor layer 54 exceeds 10 vol %, the optical system efficiency lowers compared to when the glass content rate is 0 vol %. It is conceivable that this is because the fluorescence spreads in the phosphor layer 54 while the loss caused by the fluorescence being reflected and refracted on the interface between the phosphor particle PR and the binder BN decreases as described above, the spread of the light when the fluorescence is emitted from the phosphor layer 54 increases, and the intensity of the light which can be used in the optical device 30 as the optical system decreases to appear as a difference in measurement value. Further, it is conceivable that the reason that the peak is shown in a range no lower than 0% and no higher than 10% is that when the binder BN is extremely small in amount, the excitation light repeats the reflection and the refraction a number of times on the interface between the phosphor particle PR and the void SP (air), and thus, the excitation light is discharged from the phosphor layer 54 before exciting the phosphor.

Although not shown in the drawings, in the phosphor layer the glass content rate of which is 30 vol %, and the phosphor layer the glass content rate of which is 20 vol %, the surfaces of all of the phosphor particles PP are substantially completely covered with the binder BN. In particular, in the phosphor layer the glass content rate of which is 30 vol %, the phosphor particles PR are buried in the binder BN. When the phosphor particles PR are covered with the binder BN as borosilicate glass in such a manner, the fluorescence generated in the phosphor particles PR becomes easy to propagate the binder BN, the spread of the light emitted from the phosphor layer broadens, and the optical system efficiency decreases as described above.

In contrast, in the phosphor layers the glass content rates of which are 10 vol %, 5 vol %, and 3 vol %, respectively, the binder BN is disposed between the phosphor particles PR adjacent to each other, and the phosphor particles PR are not completely covered with the binder BN. In particular, in the phosphor layers the glass content rates of which are 5 vol % and 3 vol %, respectively, the binder BN is only disposed between the phosphor particles PR adjacent to each other, and the surface of each of the phosphor particles PR is almost exposed.

As described above, since the phosphor particles PR adjacent to each other are bound to each other in a part of the surface with the binder BN, and the other part is exposed, the spread of the light emitted from the phosphor layer decreases, and thus, the optical system efficiency is enhanced.

Therefore, by setting the glass content rate of the phosphor layer 54 to the value within the range higher than 0 vol % and no higher than 10 vol %, it is possible to constitute the phosphor layer capable of increasing the optical system efficiency compared to when the glass content rate is 0 vol %, and when the glass content rate is higher than 10 vol %.

Surface Area of Phosphor Particle

Figure 9:
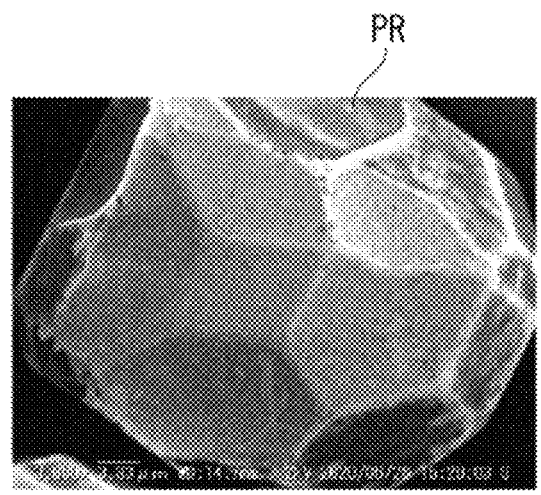
FIG. 9 is an image showing the phosphor particle on which etching has not been performed in the embodiment.
Figure 10:
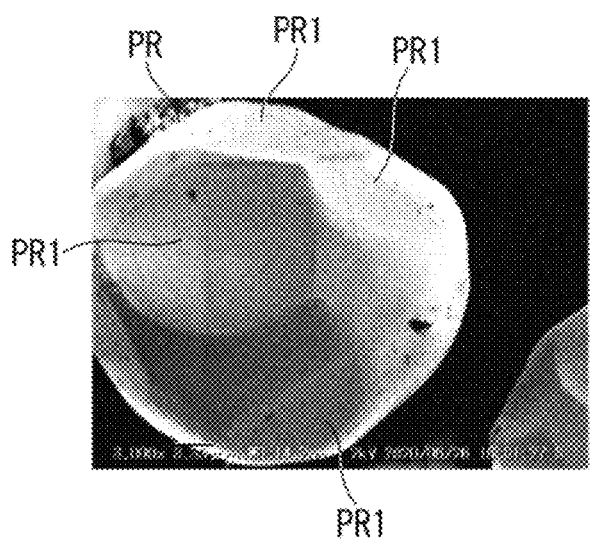
FIG. 10 is an image showing the phosphor particle on which etching has been performed in the embodiment.

FIG. 9 is an SEM image of the phosphor particle PR on which etching has not been performed. FIG. 10 is an SEM image of the phosphor particle PR on which etching has been performed. It should be noted that SEM represents a scanning electron microscope, and the SEM image is an image obtained when observing an object with the SEM.

The phosphor layer 54 of the wavelength conversion element 51 according to the present embodiment includes the phosphor particles PR each provided with a plurality of concave portions PR1 formed by etching in a concave portion formation step S2 described later.

Here, the phosphor particles PR on which the etching has not been performed are each a polyhedron having a relatively smooth surface as shown in FIG. 9. By performing the etching on such a phosphor particle PR, a plurality of concave portions PR1 is formed on the surface of the phosphor particle PR as shown in FIG. 10. The concave portions PR1 are each a concave curve recessed toward the inside of the phosphor particle PR. The size of the concave portion PR1 increases in proportion to the etching time.

The surface area of the phosphor particle PR having the concave portions PR1 becomes larger than the surface area of the phosphor particle PR on which the etching has not been performed, namely the surface area of the phosphor particle PR not provided with the concave portions PR1.

For example, when assuming that a circular plane with the radius of "a" exists in the phosphor particle PR before the etching, the area of that plane is $a_2\pi$.

When assuming that the concave portion is formed on the surface of the phosphor particle PR due to the etching, and the surface of the concave portion is removed by the etching as much as 0.5 μm, the surface area of the concave curve increases $1+(d/a)^2$ times. Assuming that the radius a is 5 μm, and the depth d is 2 μm, the surface area of the concave curve on which the etching has been performed increases about 1.16 times as large as the surface area of the plane on which the etching has not been performed.

Since the surface area increases, the reflectance increases, but the area of a portion through which the internal light, goes out increases, and therefore, the light emitted increases. Further, since the light reflected by the internal concave surface does not converge but diverges, emission of the light from other surfaces increases.

Further, the surface of the phosphor particle PR becomes the concave surface due to the etching, but this phenomenon can be understood from the fact that the etching is performed centering on a starting point on the surface. Further, by the plane portion including the ridge lines formed on the surface of the phosphor particle PR turning to the curved portion, the multiple reflection of the inside light which has occurred in the vicinity of the ridge line disappears, and it becomes easy for the fluorescence to go out from the inside of the phosphor particle PR to the outside.

In the present embodiment, as the phosphor particles PR included in the phosphor layer 54, there are used phosphor particles which have an average particle diameter of 30 μm, and the size of the concave portion PR1 of which is no smaller than 0.1λ and no larger than 10λ. The character λ represents the wavelength of the fluorescence generated by the phosphor particles when the excitation light enters the phosphor particles.

It should be noted that the inventors measured a difference between the characteristic of the phosphor particles PR on which the etching has not been performed and the characteristic of the phosphor particles PR on which the etching has been performed. This point will be described later in detail.

Method of Manufacturing Wavelength Conversion Element

Figure 11:
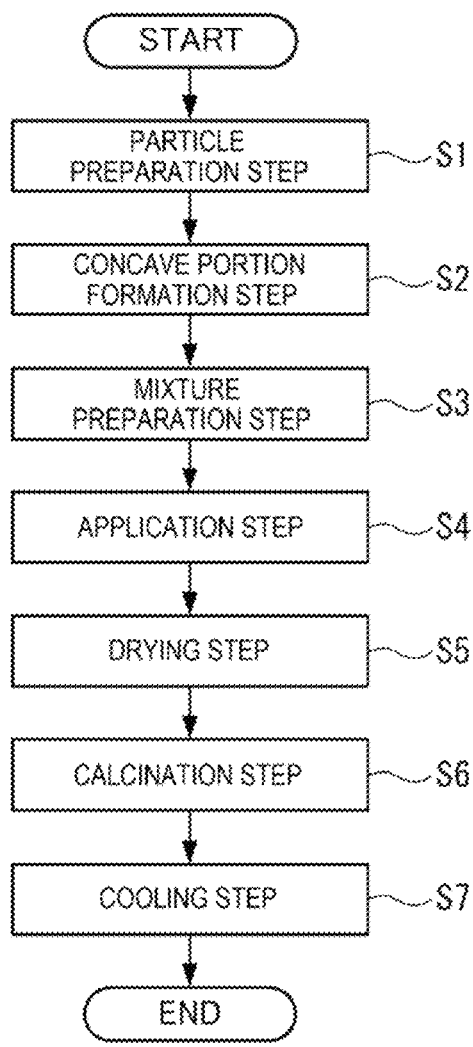
FIG. 11 is a flowchart showing a method of manufacturing the wavelength conversion element according to the embodiment.

FIG. 11 is a flowchart showing the method of manufacturing the wavelength conversion element 51.

The method of manufacturing the wavelength conversion element 51 including the phosphor layer 54 will hereinafter be described.

As shown in FIG. 11, the method of manufacturing the wavelength conversion element 51 includes a particle preparation step S1, the concave portion formation step S2, the mixture preparation step S3, an application step S4, a drying step S5, a calcination step S6, and a cooling step S7 to be executed in sequence. In other words, the method of manufacturing the wavelength conversion element 51 described hereinafter includes a method of manufacturing the phosphor particles.

The particle preparation step S1 is a step of preparing the phosphor particles from a polycrystalline plate of the phosphor material calcined. Specifically, first, in the particle preparation step S1, the polycrystalline plate of the phosphor material is crushed with a zirconia ball to form the phosphor particles having a particle diameter distribution no smaller than several μm and no larger than 100 μm. The phosphor particles having the particle diameter no smaller than 50 μm are extracted from the phosphor particles thus formed.

The concave portion formation step S2 is a step of forming the concave portions on the surfaces of the phosphor particles prepared in the particle preparation step S1. Specifically, in the concave portion formation step S2, by etching the surfaces of the phosphor particles for a predetermined time with strong acid at a predetermined temperature and in a predetermined concentration, the concave portions are formed on the surfaces of the phosphor particles. The size (the diameter) of such a concave portion is preferably no smaller than 0.1λ and no larger than 10λ, and more preferably no smaller than 0.5λ and no larger than 2λ.

The mixture preparation step S3 is a step of preparing a mixture which is calcined to form the phosphor layer 54. In the mixture preparation step S3, there is prepared the mixture obtained by mixing a binder constituent which is calcined to form the binder BN, a dispersant as an organic substance such as ethyl cellulose, a solvent for dissolving the binder constituent and the dispersant, and a powder of the phosphor particles each provided with the concave portions formed in the concave portion formation step S2 described above with each other. It should be noted that as the binder constituent, there can be cited what is obtained by fracturing the borosilicate glass including, for example, silica as much as 60% or more into particles having a diameter no larger than 1 μm.

Further, the ratio between the powder of the phosphor particles and the borosilicate glass as the binder constituent is set to a ratio within a range of 98:2 through 92:8 in the volume ratio. It should be noted that the range includes 98:2 and 92:8. More preferably, the ratio between the powder of the phosphor particles and the borosilicate glass is set to a ratio within a range of 97:3 through 95:5 in the volume ratio. The range includes 97:3 and 95:5. By adjusting the ratio between the powder of the phosphor particles and the borosilicate glass as described above, it is possible to set the glass content rate to a value within the range described above.

The application step S4 is a step of applying the mixture prepared in the mixture preparation step S3 on the first surface 521 of the substrate 52.

In the drying step S5, the mixture applied in the application step S4 is dried.

In the calcination step S6, the mixture thus dried and the substrate 52 are calcined.

For example, first, the substrate 52 coated with the mixture is calcined at low temperature. Specifically, the mixture and the substrate 52 are calcined at a temperature no lower than 300° C. and no higher than 500° C. at which the organic substance of the dispersant included in the mixture is decomposed. Thus, substantially all of the dispersant and the solvent are evaporated from the mixture.

Then, the mixture and the substrate 52 are calcined for a short time while raising the temperature with a baking furnace up to 1000° C. at a rate of 10° C./min. When performing the calcination at high temperature in the calcination step S6, the borosilicate glass as the binder constituent included in the mixture is melted to bind the phosphor particles included in the mixture to each other. Further, since substantially all of the dispersant and the solvent are evaporated from the mixture when calcining the mixture at high temperature, the calcination of the mixture at low temperature can be omitted. It should be rioted that the calcination temperature in the calcination step 36 will be described later in detail.

In the cooling step S7, the mixture and the substrate thus calcined are cooled. At this point, the mixture turns to the phosphor layer 54 in which the plurality of phosphor particles PR each having the concave portions PR1 are bound to each other with the binder BN.

Due to the manufacturing method including the steps S1 through S7 described hereinabove, there is manufactured the wavelength conversion element 51 having the phosphor layer 54 the area proportion and the glass content rate described above of which are higher than 0% and no higher than 10%.

Figure 12:
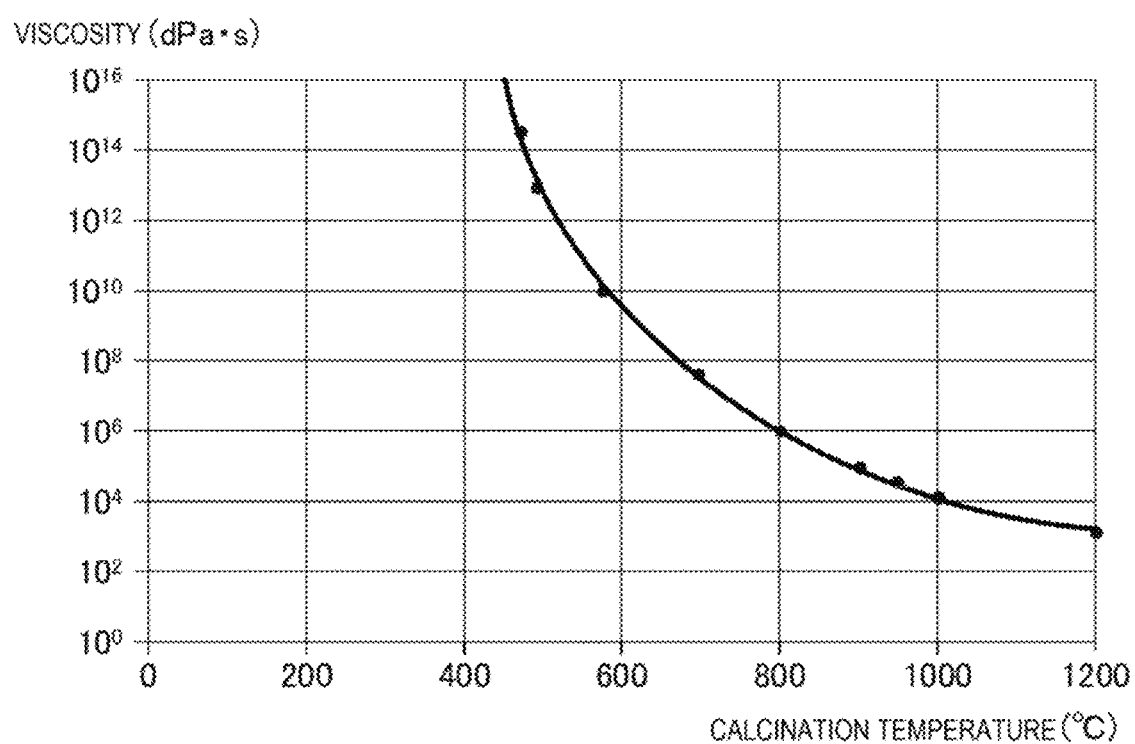
FIG. 12 is a graph showing a relationship between the calcination temperature and the viscosity of glass in the embodiment.

Relationship Between Calcination Temperature in Calcination Process and Viscosity of Glass FIG. 12 is a graph showing a relationship between the calcination temperature and the viscosity of the glass.

As shown in FIG. 12, the viscosity of the glass decreases as the temperature rises, and the force due to the viscosity of the glass weakens as the viscosity decrease. Further, assuming that the softening point as a temperature at which the glass starts to conspicuously soften to deform under its own weight, and at which the viscosity becomes about $10^{7.6}$ dPa·s is 700° C., by making the calcination temperature at the high temperature in the calcination step 36 described above no lower than 800° C. which is 100° C. higher than the softening point, the viscosity of the glass becomes no higher than $10^6$ dPa·s (=$10^6$ P).

In the phosphor layer calcined at 750° C. near to the softening point of the glass, the size of the binding part BP with respect to the diameter of the phosphor particle PR was no larger than ¼ of the diameter of the phosphor particle PR. However, in this case, since the binder BN had a granular form, and in addition, the surface was not smooth, and therefore, it was thought that the fluorescence and the excitation light having entered the binder BN were apt to be scattered. When the scattering of the fluorescence and the excitation light increases, the light path length of the fluorescence increases, and when the light path length of the fluorescence increases, the intensity of the fluorescence decreases since the frequency of occurrence of the self-absorption by the phosphor particles PR increases, and the excitation light is reflected to the outside from the phosphor layer without exciting the phosphor particles PR as described above.

Therefore, in the phosphor layer calcined at 750° C., the intensity of the fluorescence emitted from the phosphor layer decreases, and the optical system efficiency described above is apt to decrease.

In contrast, in the phosphor layer calcined at 800° C., the size of the binding part BP with respect to the phosphor particle PR was no larger than ¼ of the diameter of the phosphor particle PR. On the other hand, the size of the binding part BP in the phosphor layer calcined at 800° C. became smaller than the size of the binding part BP in the phosphor layer calcined at 750° C. Besides the above, since the calcination temperature was 100° C. higher than the softening point, and the viscosity was sufficiently low, it was through that the surface of the binder BN was made smooth, and the fluorescence having entered the binder BN was difficult to scatter. Further, when the calcination temperature was 800° C., the viscosity of the glass became no higher than $10^6$ dPa·s ($=10^6$ P), and since the viscosity was sufficiently low, it was thought that the surface of the binder BN was made smooth, and thus, the fluorescence having entered the binder BN was difficult to scatter. Therefore, it is conceivable that the occurrence of the self-absorption by the phosphor particles PR is suppressed, and the intensity of the fluorescence is prevented from decreasing compared to the phosphor layer calcined at 250° C.

Regarding the above, substantially the same thing is also applied to the phosphor layers calcined at 850° C., 900° C., 950° C., and 1000° C., respectively. In other words, since the viscosity of the glass decreases as the calcination temperature rises, the size of the binding part BP decreases, and in addition, the thickness of the binder BN as the dimension in the direction connecting the phosphor particles PR to be bound also decreases. Further, it is conceivable that the surface of the binder BN in the phosphor layer becomes smoother, and the scattering of the fluorescence is further suppressed. It is conceivable that substantially the same is applied to a phosphor layer calcined at a temperature exceeding 1000° C.

In particular, when the calcination temperature became no higher than 900° C., the viscosity became no higher than $10^5$ dPa·s, the fluidity of the glass was enhanced, and the binder BN became in a state desirable from an optical point of view and a viewpoint of thermal conduction in which the binder BN had a streamline shape to bond the phosphor particles PR adjacent to each other. Further, when the calcination temperature became 1000° C., the viscosity became $10^4$ dPa·s, and there was achieved the bonding state with near-complete fluidity.

On the other hand, when the calcination temperature in the calcination step S6 described above is made no lower than 1100° C., Ce ions as the activator agent of the phosphor are oxidized to thereby be deactivated. Therefore, from a viewpoint of the manufacturing process, it is more preferable for the calcination temperature in the calcination step S6 to be no lower than 800° C. and no higher than 1100° C. (100° C. or more and 400° C. or less higher than the softening point). Among the above, when the calcination temperature in the calcination step S6 is no lower than 900° C. and no higher than 1100° C. (200° C. or more and 400° C. or less higher than the softening point), the viscosity no higher than $10^5$ dPa·s can preferably be realized. Further, it is more desirable for the calcination temperature in the calcination step S6 to be no lower than 950° C. and no higher than 1050° C. (250° C. or more and 350° C. or less higher than the softening point). This is a temperature for realizing the viscosity of $10^4$ dPa·s, the phosphor layer is higher in emission efficiency, and the optical system efficiency described above including the optical device 30 is high.

Advantages of Embodiment

The configuration according to the present embodiment described hereinabove can exert the following advantages.

The phosphor particle PR emits the fluorescence longer in wavelength than the excitation light entering the phosphor particle PR. The phosphor particle PR has the concave portion PR1 no smaller than 0.1 times as large as the wavelength of the fluorescence and no larger than 10 times as large as the wavelength of the fluorescence on the surface.

According to such a configuration, it is possible to increase the surface area of the phosphor particle PR compared to the phosphor particle which is the same in particle diameter, and does not have the concave portion PR1. According to the above, it is possible to make it easy to emit the fluorescence generated inside the phosphor particle PR to the outside of the phosphor particle PR. Further, since the concave portion PR1 the size of which is within the range described above is disposed on the surface of the phosphor particle PR, even when the fluorescence generated inside the phosphor particle PR is reflected by the inner surface of the phosphor particle PR, the proceeding direction (the angle with the inner surface) of the fluorescence is changed by the inner surface of the concave portion PR1 to thereby make the fluorescence easy to enter the inner surface at an angle no larger than the critical angle, and thus, the fluorescence becomes easy to be emitted outside the phosphor particle PR. Thus, it is possible to reduce the absorption of the light in the inside of the phosphor particle PR, and in addition, it is possible to increase the internal quantum yield. Therefore, it is possible to increase the intensity of the fluorescence emitted from the phosphor particle PR when the excitation light enters the phosphor particle PR. Further, since the absorption of the light in the phosphor particle PR is suppressed, it is possible to prevent the heat generation in the phosphor particle, and thus, it is possible to prevent the light emission efficiency from decreasing.

The wavelength conversion element 51 is provided with the phosphor layer 54, and the substrate 52 on which the phosphor layer 54 is disposed. The phosphor layer 54 includes the plurality of phosphor particles PR, and in addition, the binder BN for binding a part of the surface of one (e.g., the phosphor particle PRA) of the phosphor particles PR adjacent to each other out of the plurality of phosphor particles PR and a part of the surface of the other (e.g., the phosphor particle PRB) of the phosphor particles PR to each other. The binder BN includes glass.

According to such a configuration, the binder BN is not bonded to the entire surface of each of the phosphor particles PR, but is bonded to only a part of the surface in each of the phosphor particles PR. This makes it possible to reduce the area of the binding part BP to be bonded to the binder on the surface of the phosphor particle PR. In other words, it is possible to increase the area of the region having contact with the void SP (air) in the surface of the phosphor particle PR. Thus, since it is possible to decrease the intensity of the fluorescence propagating the binder BN, it is possible to decrease the spread of the light emitted from the phosphor layer 54, and by extension, from the wavelength conversion element 51. Therefore, it is possible to enhance the brightness in the optical device 30 as the optical system using the light emitted from the wavelength conversion element 51, and thus, it is possible to increase the light use efficiency in the optical device 30.

The light source device 4 is provided with the wavelength conversion element 51 and the light source 401 for emitting the excitation light to be made to enter the wavelength conversion element 51.

According to such a configuration, it is possible to configure the light source device 4 which exerts substantially the same advantages as those of the wavelength conversion element 51 described above.

The method of manufacturing the phosphor particles PR for emitting the fluorescence longer in wavelength than the excitation light made to enter the phosphor particles PR includes the concave portion formation step S2 of forming the concave portions no smaller than 0.1 times and no larger than 10 times as large as the wavelength of the fluorescence on the surfaces of the phosphor particles PR.

According to such a configuration, it is possible to manufacture the phosphor particles PR which exert the advantages described above.

The method of manufacturing the wavelength conversion element 51 having the phosphor layer 54 includes the mixture preparation step S3, the application step S4, and the calcination step S6. The mixture preparation step S3 is a step of preparing the mixture obtained by mixing the phosphor particles each provided with the concave portions in the concave portion formation step S2 included in the method of manufacturing the phosphor particle described above and the binder including glass with each other. The application step S4 is a step of applying the mixture to the substrate. The calcination step S6 is a step of calcining the mixture applied to the substrate at the calcination temperature 100° C. or more higher than the softening point of the glass included in the binder.

According to such a method of manufacturing the wavelength conversion element 51, by making the calcination temperature of the mixture described above 100° C. or more higher than the softening point of the glass included in the binder, it is possible to manufacture the wavelength conversion element having the phosphor layer in which the proportion of the area of the binding part to the binder in the surface of the phosphor particle is no higher than 10% of the surface area of the phosphor particle, and the size of the binding part is no larger than ¼ of the diameter of the phosphor particle. Therefore, it is possible to prevent the scattering of the fluorescence having entered the binder, and in addition, it is possible to prevent the self-absorption by the phosphor particles from occurring, and thus, it is possible to manufacture the wavelength conversion element in which a decrease in intensity of the fluorescence is suppressed.

The method of manufacturing the wavelength conversion element 51 having the phosphor layer 54 includes the mixture preparation step S3, the application step S4, and the calcination step S6. The mixture preparation step S3 is a step of preparing the mixture obtained by mixing the phosphor particles each provided with the concave portions formed in the concave portion formation step S2 included in the method of manufacturing the phosphor particle described above and the binder including glass with each other. The application step S4 is a step of applying the mixture to the substrate. The calcination step S6 is a step of calcining the mixture so that the viscosity of the glass included in the binder becomes a value no higher than $10^6$ dPa·s.

According to such a method of manufacturing the wavelength conversion element 51, similarly to when making the calcination temperature of the mixture described above 100° C. or more higher than the softening point of the glass included in the binder, by setting the viscosity of the glass included in the binder to a value no higher than $10^6$ dPa·s, it is possible to manufacture the wavelength conversion element having the phosphor layer in which the proportion of the area of the binding part to the binder in the surface of the phosphor particle is no higher than 10% of the surface area of the phosphor particle, and the size of the binding part is no larger than ¼ of the diameter of the phosphor particle. Therefore, since it is possible to prevent the scattering of the fluorescence having entered the binder, and in addition, it is possible to prevent the self-absorption by the phosphor particles from occurring, and it is possible to prevent the reflection of the excitation light, it is possible to manufacture the wavelength conversion element in which a decrease in intensity of the fluorescence is suppressed.

The wavelength conversion element 51 is an element manufactured using the method of manufacturing the wavelength conversion element described above.

According to such a configuration, it is possible to prevent the scattering of the fluorescence having entered the binder, and in addition, it is possible to prevent the self-absorption by the phosphor particles from occurring, further, it is possible to prevent the reflection of the excitation light, and it is possible to configure the wavelength conversion element in which a decrease in intensity of the fluorescence is suppressed.

The light source device 4 is provided with the wavelength conversion element 51 manufactured using the method of manufacturing the wavelength conversion element described above, and the light source 401 for emitting the excitation light to be made to enter the wavelength conversion element 51.

According to such a configuration, it is possible to configure the light source device 4 capable of increasing the light use efficiency in the optical device 30.

The projector 1 is provided with the light source device 4, the light modulation devices 343 for modulating the light emitted from the light source device 4 in accordance with the image information, and the projection optical device 36 for projecting the light modulated by the light modulation devices 343.

According to such a configuration, it is possible to obtain substantially the same advantages as those of the light source device 4 described above. Further, thus, it is possible to increase the brightness of the image to be projected by the projector 1.

MODIFICATIONS OF EMBODIMENT

The present disclosure is not limited to the embodiment described above, but includes modifications, improvements, and so on in the range in which the advantages of the present disclosure can be achieved.

In the embodiment described above, it is assumed that the concave portions PR1 are formed on the surfaces of the phosphor particles PR by performing etching on the phosphor particles PR. However, this is not a limitation, and it is possible to form the concave portions PR1 on the surface of the phosphor particles PR using other methods. Further, the size of the concave portion PR1 is not necessarily required to be within the range of no larger than 0.1 times and no smaller than 10 times as large as the wavelength of the fluorescence depending on, for example, the particle diameter of the phosphor particle.

Further, the method of manufacturing the phosphor particles PR having the concave portions PR1 sufficiently includes the concave portion formation step S2 described above, and can also include other steps.

In the embodiment described above, it is assumed that the wavelength conversion element 51 has the phosphor layer 54 including the plurality of phosphor particles PR each having the concave portions PR1, and the binder BN for binding a part of the surface of one of the phosphor particles adjacent to each other out of the plurality of phosphor particles PR and a part of the surface of the other of the phosphor particles to each other, and the substrate 52 on which the phosphor layer 54 is disposed. Further, it is assumed that the binder BN includes glass. However, this is not a limitation, and it is possible for the binder BN to include other binders than glass such as silicone.

In the embodiment described above, it is assumed that the dimension in the X axis of the binding part BP to be bonded to the binder BN in the surface of the phosphor particle PR is no larger than ¼ of the diameter of the phosphor particle PR, and the dimension in the Y axis of the binding part BP is no larger than ¼ of the diameter of the phosphor particle PR. However, this is not a limitation, and the size of the binding part BP is not limited to the above providing the proportion of the area of the binding part BP to the surface area of the phosphor particle PR becomes a value no higher than 10%, and preferably becomes a value no lower than 3% and no higher than 5%.

Further, when the dimension in the X axis and the dimension in the Y axis of the binding part BP each become no larger than ¼ of the diameter of the phosphor particle PR, it is not required for the proportion of the area of the binding part BP to the surface area of the phosphor particle PR to become a value no higher than 10%, or preferably become a value no lower than 3% and no higher than 5%.

Further, it is also possible for the dimension in one of the X axis and the Y axis of the binding part BP to exceed ¼ of the diameter of the phosphor particle PR.

In the embodiment described above, it is assumed that the glass content rate of the phosphor layer 54 is higher than 0 vol % and no higher than 10 vol %. In other words, it is assumed that the proportion of the volume of the binder BN to the total volume of the sum of the volumes of the phosphor particles PR and the sum of the volumes of the binder BN is larger than 0 vol % and no larger than 10 vol %. However, this is not a limitation, and the proportion of the volume can exceed 10 vol % within a range in which it is determined that the optical system efficiency is sufficiently high. It should be noted that the proportion of the volume is a value when manufacturing the phosphor layer 54 as described above.

Further, the phosphor layer 54 is not limited to the configuration in which the binder BN binds only a part of the surface of the phosphor particle PR, but can be provided with a configuration in which substantially the entire surface of the phosphor particle PR is covered with the binder BN.

In the embodiment described above, it is assumed that the method of manufacturing the wavelength conversion element 51 includes the particle preparation step S1, the concave portion formation step S2, the mixture preparation step S3, the application step S4, the drying step S5, the calcination step S6, and the cooling step S7. However, this is not a limitation, and any of the steps S1 through S7 can be eliminated. For example, the drying step S5 can be eliminated, and the cooling step 37 can be eliminated. Further, providing the phosphor particles PR having the concave portions PR1 can be prepared, it is sufficient for the method of manufacturing the wavelength conversion element 51 to include the mixture preparation step S3, the application step S4, and the calcination step S6.

In the embodiment described above, it is assumed that the viscosity of the glass in the calcination step S6 is a value no higher than $10^6$ dPa·s. In other words, it is assumed that the calcination temperature is made 100° C. or more higher than the softening point of the glass so that the viscosity of the glass takes a value no higher than $10^6$ dPa·s. However, this is not a limitation, the calcination temperature in the calcination step S6 is not required to be 100° C. or more higher than the softening point of the glass. Meanwhile, the calcination temperature is not required to be 100° C. or more higher than the softening point of the glass to be the binder BN providing the viscosity of the glass takes a value no higher than $10^6$ dPa·s. Further, providing the calcination temperature is 100° C. or more higher than the softening point of the glass, the viscosity of the glass to be the binder BN is not required to be no higher than $10^6$ dPa·s in the calcination step S6. It should be noted that it is preferable to satisfy at least either one of the fact that the calcination temperature is 100° C. or more higher than the softening point of the glass, and the fact that the viscosity of the glass is no higher than $10^6$ dPa·s in the calcination step S6.

In the embodiment described above, the phosphor particles PR having the concave portions PR1 are applied to the reflective wavelength conversion element 51 in which the phosphor layer 54 is located on the incident side of the excitation light with respect to the substrate 52, and the fluorescence is emitted toward the incident side of the excitation light. However, this is not a limitation, and it is also possible to apply the phosphor particles PR having the concave portions PR1 to a transmissive wavelength conversion element for emitting the fluorescence along the incident direction of the excitation light. In the case of the transmissive wavelength conversion element, sapphire is preferably used as the substrate.

Further, when configuring the wavelength conversion element 51 having the phosphor layer 54 including the phosphor particles PR as the transmissive wavelength conversion element, it is possible to dispose a dielectric multi-layer film for reflecting the light emitted from the phosphor layer 54 between the phosphor layer 54 and the substrate 52.

In the embodiment described above, it is assumed that the wavelength conversion element 51 has the configuration of being rotated by the rotating device 59. However, this is not a limitation, and it is also possible to adopt a configuration in which the wavelength conversion element is not rotated. In other words, the rotating device for rotating the wavelength conversion element can be eliminated. In this case, the phosphor layer 54 is not required to be formed to have an annular shape when viewed from the incident side of the excitation light, and can also be formed to have, for example, a circular shape or a polygonal shape. Further, the shape of the phosphor layer 54 can also be a circular shape or a polygonal shape when viewed from the incident side of the excitation light irrespective of whether or not the phosphor layer 54 is rotated. The same applies to the shape of the substrate 52.

In the embodiment described above, it is assumed that the projector 1 is equipped with the three light modulation devices 343 (343B, 343G, and 343R). However, this is not a limitation, and the present disclosure can also be applied to a projector equipped with two or less, or four or more light modulation devices.

In the embodiment described above, it is assumed that the projector 1 is provided with the light modulation devices 343 each having the transmissive type liquid crystal panel having the plane of incidence of light and the light emission surface different from each other. However, this is not a limitation, but it is also possible to adopt a configuration in which the light modulation device each have a reflective type liquid crystal panel having the plane of incidence of light and the light exit surface coinciding with each other. Further, it is also possible to use a light modulation device other than the liquid crystal device such as a device using a micromirror such as a digital micromirror device (DMD) providing the light modulation device is capable of modulating the incident light beam to form the image corresponding to the image information.

In the embodiment described above, there is cited the example in which the phosphor particles PR are applied to the phosphor layer 54 of the wavelength conversion element 51, the wavelength conversion element 51 is applied to the light source device 4, and the light source device 4 is applied to the projector 1. However, this is not a limitation, and the phosphor particles PR can be applied to another configuration than the wavelength conversion element 51, and the wavelength conversion element 51 can be applied to another configuration than the light source device 4. The light source device can be adopted in, for example, lighting equipment, and a head light for a vehicle or the like. Further, the configuration of the light source device is not limited to the configuration described above, and providing the light source device has a configuration provided with the wavelength conversion element and the light source for emitting the light which enters the wavelength conversion element, other components constituting the light source device can arbitrarily be changed. The same applies to the projector.

PRACTICAL EXAMPLES

Some practical examples implemented by the inventors will hereinafter be described.
Case of Using YAG:Ce Phosphor Material The inventors considered configuring the phosphor layer, and by extension, the wavelength conversion element 51, using the YAG:Ce phosphor material as the phosphor material.

When putting the phosphor particles made of the YAG:Ce phosphor material having the average particle diameter of 30 μm in a strong acid for a predetermined time, the surface of the phosphor particle is etched. Since the phosphor particle is formed of a polycrystal, and the particle boundary is etched by the strong acid solution, the concave portions in the order of the wavelength of the visible light are formed on the surface in a row. By bonding such phosphor particles in the area 5% through 50%, preferably 10% through 30% of the surface area of each of the phosphor particles with the glass binder, it is possible to reduce the number of times of the total reflection by the air interface or the glass interface, and thus, it becomes easy to take the fluorescence out of the phosphor particles. Similarly, when using a silicone binder as the binder, it is possible to prevent the fluorescence from being confined inside the phosphor particle due to the total reflection caused by a difference in refractive index from the phosphor.

It is important for the size of the concave portion to be formed on the surface of the phosphor particle to be in the order of the wavelength in which the fluorescence is reflected or transmitted. Defining the wavelength of the fluorescence emitted by the phosphor particles as λ, the size of the concave portion is preferably no smaller than 0.2λ, and no larger than 10λ, and is more preferably no smaller than 0.5λ, and no larger than 2λ. Assuming that the fluorescence is light having the wavelength no smaller than 500 nm and no larger than 800 nm, the wavelength λ takes a value no smaller than 0.5 μm and no larger than 0.8 μm.

It should be rioted that when the size of the concave portion formed on the surface of the phosphor particle is smaller than the range described above, the binder fails to enter the concave portion to cause a void (a gap) between the surface of the concave portion and the binder in some cases. When the refractive index of the binder is close to the refractive index of the phosphor particle, the void formed between the surface of the concave portion and the binder functions to scatter the light. However, when the refractive index difference as the difference between the refractive index of the binder and the refractive index of the phosphor particle is large, for example, when the refractive index difference is no smaller than 0.3, it is preferable in cooling the phosphor particle to decrease the viscosity of the binder to thereby decrease the void to make the binder adhere to the surface of the concave portion to thereby increase the thermal conductivity.
Case of Using Lanthanum Silicon Nitride Phosphor Material The inventors considered configuring the phosphor layer, and by extension, the wavelength conversion element 51, using the lanthanum silicon nitride phosphor material which is a nitride phosphor as the phosphor material.

The inventors performed etching on the surfaces of lanthanum silicon nitride phosphor particles having an average particle diameter of about 30 μm in a similar manner to the above to form the concave portions having the depth of about 1 μm on the surfaces of the phosphor particles.

Here, since the refractive index of the lanthanum silicon nitride phosphor material is no lower than 2.2, there has been a problem that the fluorescence generated inside the phosphor particles including the lanthanum silicon nitride phosphor material causes the total reflection on the inner surface of the phosphor particle, and is absorbed inside the phosphor particle without getting out of the phosphor particle.

To cope with the above, by forming fine concave portions on the surface of the phosphor particle in a row, the emission direction (angle) from the inside toward the outside of the phosphor particle is changed by the inner surface of the concave portion, and it becomes easy for the fluorescence to be discharged outside the phosphor particle.

Although the internal yield of the lanthanum silicon nitride phosphor is in a range of 80 through 89%, since the confinement of the light in the inside of the phosphor becomes difficult to occur by forming the concave portions on the surface of the phosphor particle, the internal yield becomes in a range of 90 through 95%, or no lower than 95%.
Regarding Other Phosphor Materials In the practical examples described above, the YAG:Ce phosphor material and the lanthanum silicon nitride phosphor material are used as the phosphor material. However, these are not limitations, and it is possible to similarly use the LuAG phosphor material and the GdYAG phosphor material as the phosphor material forming the phosphor particles as described above. Further, since the refractive index of the phosphor particles formed of the SCASN phosphor or the CASN phosphor becomes higher than the refractive index of the phosphor particles formed of the YAG:Ce phosphor material, the extraction of the light becomes easy due to the refractive index difference from the binder and the refractive index difference from the air, and it is possible to prevent the deterioration of the use efficiency of the light. Further, by preventing the deterioration of the use efficiency of the light, it is possible to enhance the light emission efficiency in the phosphor particles.

It should be noted that although the details will be described later, it is also possible to configure the light source adopting the phosphor layer in which the polycrystalline plate of the YAG:Ce phosphor is etched to form the concave portions on the surface of the polycrystalline plate to enhance the efficiency of the extraction of the light from the phosphor layer.

Configuration of Phosphor Layer

The inventors applied the phosphor particles on which the etching has been performed such as the YAG:Ce phosphor particles on which the etching has been performed or the lanthanum silicon nitride phosphor material on which the etching has been performed to the substrate which has a reflecting layer and has the thermal conductivity together with the binder, and then calcined the substrate to thereby form the phosphor layer including the phosphor particles on which the etching has been performed and the binder on the substrate. The wavelength conversion element is constituted by the phosphor layer and the substrate. It should be noted that as the material of the binder, there is adopted glass or silicone.

The particle diameter of the phosphor particles on which the etching has been performed is made no smaller than about 20 μm and no larger than about 30 μm. After mixing the phosphor particles on which the etching has been performed and the binder with each other, the mixture is fixed to the substrate so as to have the thickness of about 100 μm. In other words, the thickness of the phosphor layer constituted by the phosphor particles and the binder is about 100 μm. When calcining such a phosphor layer on the substrate, the binder adheres to about 1/10 of the surface area of the phosphor particle, and the rest of the surface of the phosphor particle forms the interface with the air as shown in FIG. 5. Since the concave portions having the depth of about 1 μm are formed on the surface of the phosphor particles due to the etching, a part of the fluorescence generated inside the phosphor particle is emitted outside from the inside of the phosphor particle, and the rest of the fluorescence is totally reflected by the inner surface of the phosphor particle. On this occasion, the fluorescence is totally reflected by the inner surface of the concave portion formed on the surface, and thus, the angle of the reflection direction is converted into a variety of angles, and the fluorescence proceeds inside the phosphor. Such fluorescence is reflected by the inner surface of the phosphor particle a plurality of times, and then goes out to the air as the outside of the phosphor particle.

Difference in Absorption and Internal Quantum Yield by Shape of Phosphor Particle The inventors measured the absorption of the excitation light and the internal quantum yield using a fluorescence spectrometer with respect to the phosphor particle on which the etching has not been performed and the phosphor particle on which the etching has been performed. The measurement result is shown in Table 1 below.

TABLE 1

|  | Phosphor particle not etched | Phosphor particle etched | Increment by etching |
| --- | --- | --- | --- |
| Absorption | 85.26% | 84.81% | −0.45% |
| Internal quantum yield | 99.68% | 100% | +0.35% |

The absorption of the phosphor particle on which the etching has been performed decreased by 0.45% compared to the absorption of the phosphor particle on which the etching has not been performed. On the other hand, the internal quantum yield of the phosphor particle on which the etching has been performed increased by 0.35 compared to the internal quantum yield of the phosphor particle on which the etching has not been performed. Therefore, it was found out that the light becomes difficult to be absorbed in the phosphor particle on which the etching has been performed compared to the phosphor particle on which the etching has not been performed.

It is inferable that the cause for the fact that the absorption is high and the internal quantum yield is low in the phosphor particle on which the etching has not been performed is that the phosphor particle generated by crushing the polycrystalline plate of the phosphor material with the zirconia ball, namely the phosphor particle on which the etching has not been performed, is a polyhedron having a plurality of planes, and the angle between the planes of the polyhedron is constant, and therefore, the fluorescence generated inside the phosphor particle is confined inside the phosphor particle, and is then absorbed in the inside of the phosphor particle.

On the other hand, it is inferable that the cause for the fact that the absorption is low and the internal quantum yield is high in the phosphor particle on which the etching has been performed is that the angle (the proceeding direction) of the fluorescence is changed by the inner surface of the concave portion of the phosphor particle formed by the etching as described above, and by such a change occurring a plurality of times, it becomes easy for the fluorescence to be discharged to the outside of the phosphor particle.

As described above, by etching the phosphor particle, it is possible to facilitate the extraction of the light from the phosphor particle, and thus, it is possible to increase the intensity of the light emitted from the phosphor particle, and by extension, from the phosphor layer.

It should be noted that there will be described when using the polycrystalline plate which includes the phosphor material and which has been etched instead of using the phosphor particle on which the etching has been performed.

The inventors measured the absorption of the excitation light and the internal quantum yield using the fluorescence spectrometer in substantially the same measurement condition as described above with respect to the polycrystalline plate on which the etching has been performed instead of the phosphor particle on which the etching has been performed. The measurement result is shown in Table 2 below.

TABLE 2

|  | Polycrystalline plate not etched | Polycrystalline plate etched | Increment by etching |
| --- | --- | --- | --- |
| Absorption | 74.2% | 75.5% | +1.3% |
| Internal quantum yield | 93.5% | 98.0% | +4.5% |

The absorption of the polycrystalline plate on which the etching has been performed increased by 1.3% compared to the absorption of the polycrystalline plate on which the etching has not been performed. On the other hand, the internal quantum yield of the polycrystalline plate on which the etching has been performed increased by 4.5% compared to the internal quantum yield of the polycrystalline plate on which the etching has not been performed. Therefore, it was found out that the absorption of the light slightly increases but the internal quantum yield increases in the polycrystalline plate on which the etching has been performed compared to the polycrystalline plate on which the etching has not been performed.

It is inferable that the cause for this phenomenon is that the surface area increases and the plane portion decreases by the etching in the polycrystalline plate on which the etching has been performed, and therefore, the absorption slightly increases compared to the polycrystalline plate on which the etching has not been performed.

On the other hand, it is inferable that in the polycrystalline plate on which the etching has been performed, the confinement of the light inside the phosphor is suppressed due to the increase in surface area, and thus, it becomes easy for the fluorescence generated inside the phosphor to be emitted to the outside, and therefore, the internal quantum yield increased.

As described above, by etching the polycrystalline plate including the phosphor material, it is possible to increase the intensity of the light emitted from the polycrystalline plate, and by extension, from the phosphor layer due to substantially the same reason as in the phosphor particle on which the etching has been performed.

Brightness when Bound with Silicone Binder

Figure 13:
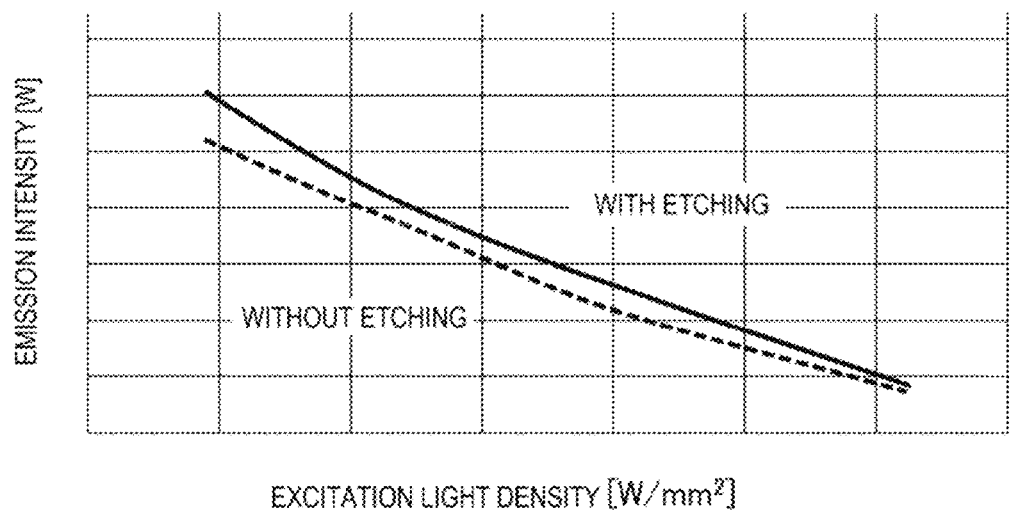
FIG. 13 is a graph showing a relationship between the excitation light density and an emission intensity in the phosphor particle on which etching has not been performed and the phosphor particle on which etching has been performed in the embodiment.
Figure 14:
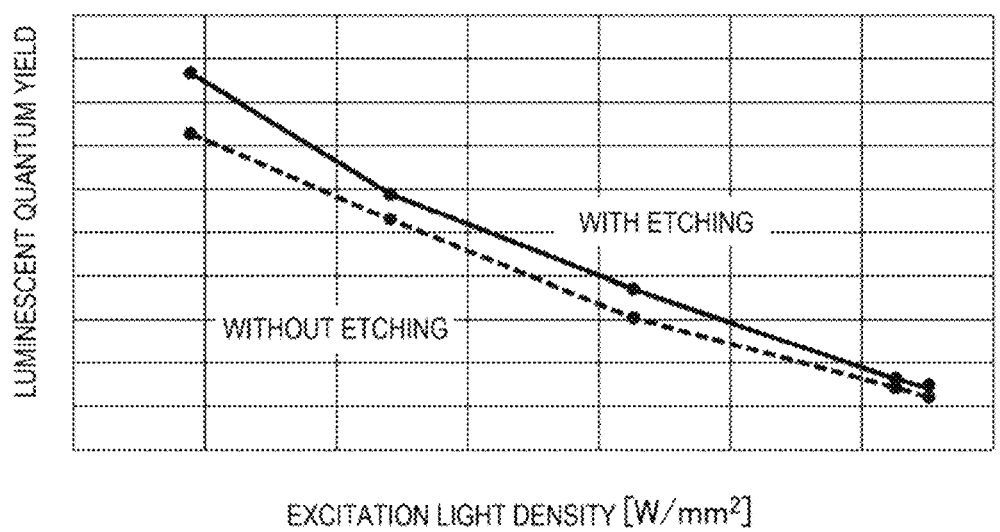
FIG. 14 is a graph showing a relationship between the excitation light density and a luminescent quantum yield in the phosphor particle on which etching has not been performed and the phosphor particle on which etching has been performed in the embodiment.

FIG. 13 is a graph showing a relationship between the excitation light density and an emission intensity in the phosphor particle on which the etching has not been performed and the phosphor particle on which the etching has been performed. FIG. 14 is a graph showing a relationship between the excitation light density and a luminescent quantum yield in the phosphor particle on which the etching has not been performed and the phosphor particle on which the etching has been performed.

Then, the relationship between the excitation light density and the emission intensity was measured using a phosphor powder on which the etching has not been performed and a phosphor powder on which the etching has been performed. Specifically, the phosphor powder bound on an aluminum substrate with a transparent silicone adhesive was irradiated with the excitation light of 455 nm, and then the light emitted from the phosphor powder was measured. In the measurement, a homogenous excitation spot of 0.6 mm² was formed on the phosphor, and the intensity of the fluorescence emitted from phosphor irradiated with the spot was measured with a spectrometer. The excitation light density is 0 through 70 W/mm², and the emission intensity is about 50%.

The dotted line in FIG. 13 represents the relationship between the excitation light density and the emission intensity in the phosphor particle on which the etching has not been performed, and the solid line in FIG. 13 represents the relationship between the excitation light density and the emission intensity in the phosphor particle on which the etching has been performed.

It should be noted that the relationship between the quantum yield and the excitation light density calculated based on the emission intensity measured is shown in FIG. 14 defining (emission intensity)×(wavelength) as the quantum yield. The dotted line in FIG. 14 represents the relationship between the excitation light density and the quantum yield in the phosphor particle on which the etching has not been performed, and the solid line in FIG. 14 represents the relationship between the excitation light density and the quantum yield in the phosphor particle on which the etching has been performed.

As shown in FIG. 13, in the phosphor particle on which the etching has been performed, the emission intensity became higher in the same excitation light density compared to the phosphor particle on which the etching has not been performed within the range of the excitation light density no lower than 10 W/mm² and no higher than 60 W/mm². In the detailed description, the emission intensity in the phosphor particle on which the etching has been performed increased by about 2% compared to the emission intensity in the phosphor particle on which the etching has not been performed.

In other words, as shown in FIG. 14, in the phosphor particle on which the etching has been performed, the quantum yield became higher in the same excitation light density compared to the phosphor particle on which the etching has not been performed within the range of the excitation light density no lower than 10 W/mm and no higher than 60 W/mm².

As described above, it was understood that by forming the phosphor layer including the phosphor particles on which the etching has been performed, the emission intensity and the internal yield increased compared to the phosphor layer including the phosphor particles on which the etching has not been performed.

Spread of Light

Figure 15:
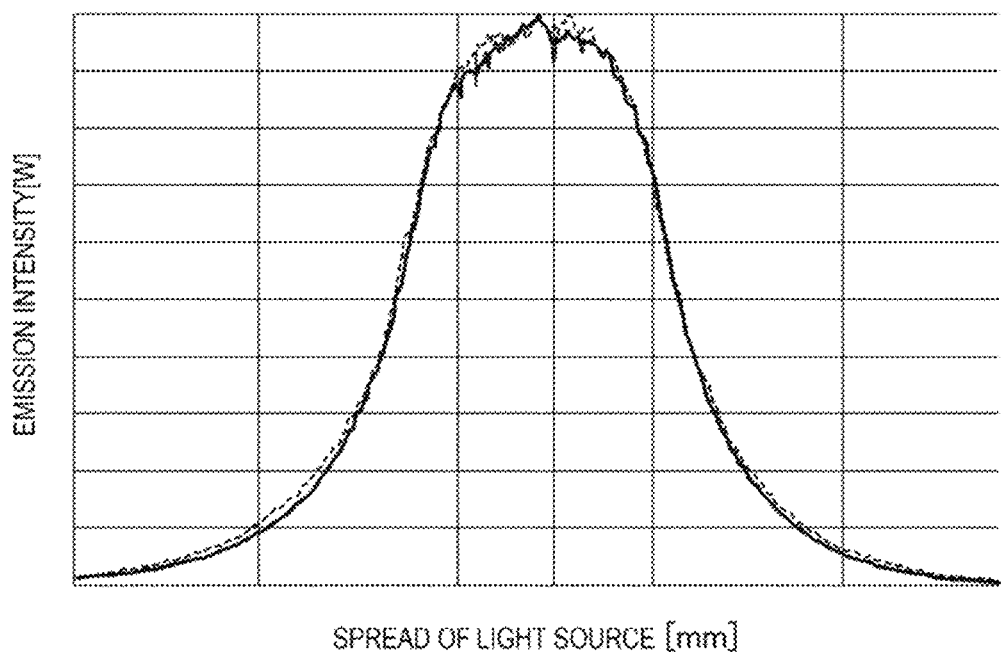
FIG. 15 is a graph showing a measurement result of the spread of the light emitted from a phosphor layer in the embodiment.

FIG. 15 is a graph showing a measurement result of the spread of the light emitted from the phosphor layer using the phosphor particles on which the etching has not been performed, and the spread of the light emitted from the phosphor layer using the phosphor particles on which the etching has been performed.

Further, the inventors irradiated the phosphor layer including the phosphor particles on which the etching has not been performed and the phosphor layer including the phosphor particles on which the etching has been performed with the excitation light, and then measured the spread of the light emitted from each of the phosphor layers. In the measurement, the emission intensity of the yellow phosphor when irradiating the phosphor with the blue light which was emitted from an LED, which had a homogeneous intensity, and which had a square shape of about 0.6 mm² was imaged with an imaging element.

As represented by the solid line in FIG. 15, in the light beam emitted from the phosphor layer including the phosphor particles on which the etching has been performed, the spread in the diametrical direction is slightly suppressed compared to the light beam emitted from the phosphor layer including the phosphor particles on which the etching has not been performed represented by the dotted line in FIG. 15. In other words, the diameter of the light beam emitted from the phosphor layer including the phosphor particles on which the etching has been performed became slightly smaller than the diameter of the light beam emitted from the phosphor layer including the phosphor particles on which the etching has not been performed. It should be noted that in the phosphor layer including the phosphor particles on which the etching has been performed, the emission intensity is high despite the diameter of the light beam to be emitted is small, therefore, the intensity of the light emitted from the phosphor particles becomes high. In other words, since the larger amount of fluorescence is discharged from the smaller light source section, when converging the fluorescence on the liquid crystal panel, it is possible to suppress the spread of the light, and thus, an optical system higher in luminance is achieved.

As described above, by using the phosphor layer including the phosphor particles on which the etching has been performed, it is possible to reduce the diameter of the light beam to be emitted from the phosphor layer, and by extension, from the wavelength conversion element, and therefore, it is possible to enhance the light use efficiency in the optical component which the light emitted from the wavelength conversion element enters, such as the optical device 30.

CONCLUSION OF PRESENT DISCLOSURE

Hereinafter, the conclusion of the present disclosure will additionally be described.

A phosphor particle according to a first aspect of the present disclosure is a phosphor particle configured to emit fluorescence longer in wavelength than excitation light entering the phosphor particle, and includes a concave portion which is no smaller than 0.1 times as large as the wavelength of the fluorescence and no larger than 10 times as large as the wavelength of the fluorescence, and which is disposed on a surface of the phosphor particle.

According to such a configuration, it is possible to increase the surface area of the phosphor particle compared to the phosphor particle which is the same in particle diameter, and does not have the concave portion. According to the above, it is possible to make it easy to emit the fluorescence generated inside the phosphor particle to the outside of the phosphor particle. Further, since the concave portion the size of which is within the range described above is disposed on the surface of the phosphor particle, even when the fluorescence generated inside the phosphor particle is reflected by the inner surface of the phosphor particle, the proceeding direction (the angle with the inner surface) of the fluorescence is changed by the inner surface of the concave portion to thereby make the fluorescence easy to enter the inner surface at an angle no larger than the critical angle, and thus, the fluorescence becomes easy to be emitted outside the phosphor particle. Thus, it is possible to reduce the absorption of the light in the inside of the phosphor particle, and in addition, it is possible to increase the internal quantum yield. Therefore, it is possible to increase the intensity of the fluorescence emitted from the phosphor particle when the excitation light enters the phosphor particle. Further, since the absorption of the light in the phosphor particle is suppressed, it is possible to prevent the heat generation in the phosphor particle, and thus, it is possible to prevent the light emission efficiency from decreasing.

A wavelength conversion element according to a second aspect of the present disclosure includes a phosphor layer including a plurality of the phosphor particles, and a binder configured to bind a part of a surface of one of the phosphor particles adjacent to each other out of the plurality of the phosphor particles and a part of a surface of another of the phosphor particles to each other, and a substrate provided with the phosphor layer, wherein the binder includes glass.

According to such a configuration, the binder is not bonded to the entire surface of the phosphor particle, but is bonded to only a part of the surface in the phosphor particle. This makes it possible to reduce the area of the binding part to be bonded to the binder on the surface of the phosphor particle. In other words, it is possible to increase the area of the region having contact with the void (air) in the surface of the phosphor particle. Thus, since it is possible to decrease the intensity of the fluorescence propagating the binder, it is possible to decrease the spread of the light emitted from the phosphor layer, and by extension, from the wavelength conversion element. Therefore, it is possible to enhance the brightness in the optical system using the light emitted from the wavelength conversion element, and thus, it is possible to increase the light use efficiency in the optical system.

A light source device according to a third aspect of the present disclosure includes the wavelength conversion element described above, and a light source configured to emit excitation light which enters the wavelength conversion element.

According to such a configuration, substantially the same advantages as those of the wavelength conversion element described above can be exerted.

A method of manufacturing a phosphor particle according to a fourth aspect of the present disclosure is a method of manufacturing a phosphor particle configured to emit fluorescence longer in wavelength than excitation light entering the phosphor particle, and includes a concave portion formation step of forming a concave portion which is no smaller than 0.1 times as large as the wavelength of the fluorescence and no larger than 10 times as large as the wavelength of the fluorescence on a surface of the phosphor particle.

According to such a configuration, it is possible to manufacture the phosphor particle which exerts the advantages described above.

A method of manufacturing a wavelength conversion element according to a fifth aspect of the present disclosure is a method of manufacturing a wavelength conversion element having a phosphor layer, including a mixture preparation step of preparing a mixture obtained by mixing the phosphor particles manufactured by the method of manufacturing the phosphor particle and a binder including glass with each other, an application step of applying the mixture to a substrate, and a calcination step of calcining the mixture applied to the substrate at a calcination temperature 100° C. or more higher than a softening point of the glass.

According to such a method of manufacturing the wavelength conversion element, by making the calcination temperature of the mixture of the phosphor particle described above and the binder 100° C. or more higher than the softening point of the glass, it is possible to manufacture the wavelength conversion element having the phosphor layer in which the proportion of the area of the binding part to the binder in the surface of the phosphor particle is no higher than 10% of the surface area of the phosphor particle, and the size of the binding part is no larger than ¼ of the diameter of the phosphor particle. Therefore, it is possible to prevent the scattering of the fluorescence having entered the binder, and in addition, it is possible to prevent the self-absorption by the phosphor particles from occurring, and thus, it is possible to manufacture the wavelength conversion element in which a decrease in intensity of the fluorescence is suppressed.

A method of manufacturing a wavelength conversion element according to a sixth aspect of the present disclosure is a method of manufacturing a wavelength conversion element having a phosphor layer, including a mixture preparation step of preparing a mixture obtained by mixing the phosphor particles manufactured by the method of manufacturing the phosphor particle and a binder including glass with each other, an application step of applying the mixture to a substrate, and a calcination step of calcining the mixture so that a viscosity of the glass takes a value no higher than $10^6$ dPa·s.

According to such a method of manufacturing the wavelength conversion element, similarly to when making the calcination temperature of the mixture of the phosphor particle described above and the binder 100° C. or more higher than the softening point of the glass, by making the viscosity of the glass no higher than $10^6$ dPa·s, it is possible to manufacture the wavelength conversion element having the phosphor layer in which the proportion of the area of the binding part to the binder in the surface of the phosphor particle is no higher than 10% of the surface area of the phosphor particle, and the size of the binding part is no larger than ¼ of the diameter of the phosphor particle. Therefore, since it is possible to prevent the scattering of the fluorescence having entered the binder, and in addition, it is possible to prevent the self-absorption by the phosphor particles from occurring, and it is possible to prevent the reflection of the excitation light, it is possible to manufacture the wavelength conversion element in which a decrease in intensity of the fluorescence is suppressed.

A wavelength conversion element according to a seventh aspect of the present disclosure is an element manufactured by the method of manufacturing the wavelength conversion element according to one of the fifth aspect and the sixth aspect.

According to such a configuration, it is possible to prevent the scattering of the fluorescence having entered the binder, and in addition, it is possible to prevent the self-absorption by the phosphor particles from occurring, further, it is possible to prevent the reflection of the excitation light, and it is possible to configure the wavelength conversion element in which a decrease in intensity of the fluorescence is suppressed.

A light source device according to an eighth aspect of the present disclosure includes the wavelength conversion element according to the seventh aspect described above, and a light source configured to emit excitation light which enters the wavelength conversion element.

According to such a configuration, it is possible to enhance the light use efficiency in the optical system which the light emitted from the light source device enters.

A projector according to a ninth aspect of the present disclosure includes the light source device according to one of the third aspect and the eighth aspect, a light modulation device configured to modulate light emitted from the light source device in accordance with image information, and a projection optical device configured to project the light modulated by the light modulation device.

According to such a configuration, substantially the same advantages as those of the light source device described above can be exerted. Further, thus, it is possible to increase the brightness of the image to be projected by the projector.

What is claimed is:

1. A phosphor particle configured to emit fluorescence longer in wavelength than excitation light entering the phosphor particle, comprising:
 a concave portion which is no smaller than 0.1 times as large as the wavelength of the fluorescence and no larger than 10 times as large as the wavelength of the fluorescence, the concave portion being disposed on a surface of the phosphor particle.

2. A wavelength conversion element comprising:
 a phosphor layer including a plurality of the phosphor particles according to claim 1, the phosphor layer further including a binder configured to bind a part of a surface of one of the phosphor particles adjacent to each other out of the plurality of the phosphor particles and a part of a surface of another of the phosphor particles to each other; and
 a substrate provided with the phosphor layer, wherein the binder includes glass.

3. A light source device comprising:
 the wavelength conversion element according to claim 2; and
 a light source configured to emit excitation light which enters the wavelength conversion element.

4. A method of manufacturing a phosphor particle configured to emit fluorescence longer in wavelength than excitation light entering the phosphor particle, the method comprising:
 forming, on a surface of the phosphor particle, a concave portion which is no smaller than 0.1 times as large as the wavelength of the fluorescence and no larger than 10 times as large as the wavelength of the fluorescence.

5. A method of manufacturing a wavelength conversion element having a phosphor layer, the method comprising:
 preparing a mixture obtained by mixing the phosphor particles manufactured by the method of manufacturing the phosphor particle according to claim 4, and a binder including glass with each other;
 applying the mixture to a substrate; and
 calcining the mixture applied to the substrate at a calcination temperature 100° C. or more higher than a softening point of the glass.

6. A method of manufacturing a wavelength conversion element having a phosphor layer, the method comprising:
 preparing a mixture obtained by mixing the phosphor particles manufactured by the method of manufacturing the phosphor particle according to claim 4, and a binder including glass with each other;
 applying the mixture to a substrate; and
 calcining the mixture so that a viscosity of the glass takes a value no higher than $10^6$ dPa·s.

7. A wavelength conversion element manufactured by the method of manufacturing the wavelength conversion element according to claim 5.

8. A wavelength conversion element manufactured by the method of manufacturing the wavelength conversion element according to claim 6.

9. A light source device comprising:
 the wavelength conversion element according to claim 7; and
 a light source configured to emit excitation light which enters the wavelength conversion element.

10. A light source device comprising:
 the wavelength conversion element according to claim 8; and
 a light source configured to emit excitation light which enters the wavelength conversion element.

11. A projector comprising:
 the light source device according to claim 3;
 a light modulation device configured to modulate light emitted from the light source device in accordance with image information; and
 a projection optical device configured to project the light modulated by the light modulation device.

12. A projector comprising:
 the light source device according to claim 9;
 a light modulation device configured to modulate light emitted from the light source device in accordance with image information; and a projection optical device configured to project the light modulated by the light modulation device.

13. A projector comprising:

the light source device according to claim 10;

a light modulation device configured to modulate light emitted from the light source device in accordance with image information; and a projection optical device configured to project the light modulated by the light modulation device.

* * * * *